(12) United States Patent
Hofmann et al.

(10) Patent No.: US 6,464,824 B1
(45) Date of Patent: Oct. 15, 2002

(54) METHODS AND APPARATUSES FOR MONITORING AND CONTROLLING MECHANICAL OR CHEMICAL-MECHANICAL PLANARIZATION OF MICROELECTRONIC SUBSTRATE ASSEMBLIES

(75) Inventors: James J. Hofmann, Boise, ID (US); Gundu M. Sabde, Boise, ID (US); Stephen J. Kramer, Boise, ID (US); Michael James Joslyn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,648

(22) Filed: Aug. 31, 1999

(51) Int. Cl.$^7$ ............................................. H01L 21/463
(52) U.S. Cl. ........................... 156/345.16; 156/345.13; 156/345.26; 156/345.25; 451/8
(58) Field of Search .............................. 451/5, 1, 8, 10, 451/41, 285, 56; 438/14, 692, 761, 795; 324/671; 216/86, 27

(56) References Cited

U.S. PATENT DOCUMENTS

| | | | |
|---|---|---|---|
| 4,351,029 A | * 9/1982 | Maxey et al. | 702/34 |
| 5,036,015 A | * 7/1991 | Sandhu et al. | 438/14 |
| 5,069,002 A | * 12/1991 | Sandhu et al. | 451/1 |
| 5,216,843 A | * 6/1993 | Breivogel et al. | 451/285 |
| 5,245,794 A | * 9/1993 | Salugsugan | 451/10 |
| 5,308,438 A | * 5/1994 | Cote et al. | 216/86 |
| 5,337,015 A | * 8/1994 | Lustig et al. | 324/671 |
| 5,595,526 A | * 1/1997 | Yau et al. | 451/8 |

OTHER PUBLICATIONS

Ferdinand P. Beer and E. Russell Johnston, Jr., Statics and Dynamics, 5th Ed. 1988, McGraw–Hill, pp. 841.*

* cited by examiner

Primary Examiner—Gregory Mills
Assistant Examiner—Rudy Zervigon
(74) Attorney, Agent, or Firm—Dorsey & Whitney LLP

(57) ABSTRACT

Methods and apparatuses for mechanical and/or chemical-mechanical planarization of semiconductor wafers, field emission displays and other microelectronic substrate assemblies. One method of planarizing a microelectronic substrate assembly in accordance with the invention includes pressing a substrate assembly against a planarizing surface of a polishing pad at a pad/substrate interface defined by a surface area of the substrate assembly contacting the planarizing surface. The method continues by moving the substrate assembly and/or the polishing pad with respect to the other to rub at least one of the substrate assembly and the planarizing surface against the other at a relative velocity. As the substrate assembly and polishing pad rub against each other, a parameter indicative of drag force between the substrate assembly and the polishing pad is measured or sensed at periodic intervals. The measured drag force can be used to generate a plot of work versus time. The work versus time plot is then integrated to determine an estimated work exerted at the pad/substrate interface. The planarizing process is terminated when the estimated thickness is at least approximately within a range of desired substrate assembly thickness for endpointing the substrate assembly according to a predetermined relationship between work and substrate assembly thickness.

34 Claims, 15 Drawing Sheets

US 6,464,824 B1

METHODS AND APPARATUSES FOR MONITORING AND CONTROLLING MECHANICAL OR CHEMICAL-MECHANICAL PLANARIZATION OF MICROELECTRONIC SUBSTRATE ASSEMBLIES

TECHNICAL FIELD

The present invention relates to methods and apparatuses for monitoring and controlling mechanical and/or chemical-mechanical planarization of semiconductor wafers, field emission displays and other types of microelectronic substrate assemblies.

BACKGROUND OF THE INVENTION

Mechanical and chemical-mechanical planarizing processes (collectively "CMP") are used in the manufacturing of electronic devices for forming a flat surface on semiconductor wafers, field emission displays and many other microelectronic substrate assemblies. CMP processes generally remove material from a substrate assembly to create a highly planar surface at a precise elevation in the layers of material on the substrate assembly.

FIG. 1 is a schematic isometric view of a web-format planarizing machine 10 for planarizing a microelectronic substrate assembly 12. The planarizing machine 10 has a table 11 with a rigid panel or plate to provide a flat, solid support surface 13 for supporting a portion of a web-format planarizing pad 40 in a planarizing zone "A." The planarizing machine 10 also has a pad advancing mechanism including a plurality of rollers to guide, position, and hold the web-format pad 40 over the support surface 13. The pad advancing mechanism generally includes a supply roller 20, first and second idler rollers 21a and 21b, first and second guide rollers 22a and 22b, and a take-up roller 23. As explained below, a motor (not shown) drives the take-up roller 23 to advance the pad 40 across the support surface 13 along a pad travel path T—T. The motor can also drive the supply roller 20. The first idler roller 21a and the first guide roller 22a press an operative portion of the pad against the support surface 13 to hold the pad 40 stationary during operation.

The planarizing machine 10 also has a carrier assembly 30 to translate the substrate assembly 12 across the pad 40. In one embodiment, the carrier assembly 30 has a head 32 to pick up, hold and release the substrate assembly 12 at appropriate stages of the planarizing process. The carrier assembly 30 also has a support gantry 34 and a drive assembly 35 that can move along the gantry 34. The drive assembly 35 has an actuator 36, a drive shaft 37 coupled to the actuator 36, and an arm 38 projecting from the drive shaft 37. The arm 38 carries the head 32 via another shaft 39. The actuator 36 orbits the head 32 about an axis B—B to move the substrate assembly 12 across the pad 40.

The polishing pad 40 may be a non-abrasive polymeric pad (e.g., polyurethane), or it may be a fixed-abrasive polishing pad in which abrasive particles are fixedly dispersed in a resin or another type of suspension medium. A planarizing fluid 50 flows from a plurality of nozzles 49 during planarization of the substrate assembly 12. The planarizing fluid 50 may be a conventional CMP slurry with abrasive particles and chemicals that etch and/or oxidize the surface of the substrate assembly 12, or the planarizing fluid 50 may be a "clean" non-abrasive planarizing solution without abrasive particles. In most CMP applications, abrasive slurries with abrasive particles are used on non-abrasive polishing pads, and non-abrasive clean solutions without abrasive particles are used on fixed-abrasive polishing pads.

In the operation of the planarizing machine 10, the pad 40 moves across the support surface 13 along the pad travel path T—T either during or between planarizing cycles to change the particular active portion of the polishing pad 40 in the planarizing zone A. For example, the supply and take-up rollers 20 and 23 can drive the polishing pad 40 between planarizing cycles such that a point P moves incrementally across the support surface 13 to a number of intermediate locations $I_1$, $I_2$, etc. Alternatively, the rollers 20 and 23 may drive the polishing pad 40 between planarizing cycles such that the point P moves all the way across the support surface 13 to completely remove a used portion of the pad 40 from the planarizing zone A. The rollers may also continuously drive the polishing pad 40 at a slow rate during a planarizing cycle such that the point P moves continuously across the support surface 13. Thus, the polishing pad 40 should be free to move axially over the length of the support surface 13 along the pad travel path T—T.

CMP processes should consistently and accurately produce a uniform, planar surface on substrate assemblies to enable circuit and device patterns to be formed with photolithography techniques. As the density of integrated circuits increases, it is often necessary to accurately focus the critical dimensions of the photo-patterns to within a tolerance of approximately 0.1 $\mu$m. Focusing photo-patterns to such small tolerances, however, is difficult when the planarized surfaces of substrate assemblies are not uniformly planar. Thus, to be effective, CMP processes should create highly uniform, planar surfaces on substrate assemblies.

In the highly competitive semiconductor industry, it is also desirable to maximize the throughput of CMP processing by producing a planar surface on a substrate assembly as quickly as possible. The throughput of CMP processing is a function of several factors; one of which is the ability to accurately stop CMP processing at a desired endpoint. In a typical CMP process, the desired endpoint is reached when the surface of the substrate assembly is planar and/or when enough material has been removed from the substrate assembly to form discrete components (e.g., shallow trench isolation areas, contacts, damascene lines). Accurately stopping CMP processing at a desired endpoint is important for maintaining a high throughput because the substrate assembly may need to be re-polished if it is "under-planarized," or too much material can be removed from the substrate assembly if it is "over-polished." For example, over-polishing can completely destroy a section of the substrate assembly or cause "dishing" in shallow-trench-isolation structures. Thus, it is highly desirable to stop CMP processing at the desired endpoint.

One method for determining the endpoint of CMP processing is described in U.S. Pat. No. 5,036,015 issued to Sandhu ("Sandhu"), which is herein incorporated by reference. Sandhu discloses detecting the planar endpoint by sensing a change in friction between a wafer and the polishing medium. Such a change of friction may be produced by a different coefficient of friction at the wafer surface as one material (e.g., an oxide) is removed from the wafer to expose another material (e.g., a nitride). In addition to the different coefficients of friction caused by a change of material at the substrate surface, the friction between the wafer and the planarizing medium can change during CMP processing because the surface area of the substrate contacting the polishing pad changes as the substrate becomes more planar. Sandhu discloses endpointing CMP processing by measuring the electrical current through the platen drive motor and/or the drive motor for the substrate holder to estimate the friction between the substrate assembly and the polishing pad and detecting a change in the motor current.

Although Sandhu discloses a viable process for endpointing CMP processing, the change in electrical current through the platen and/or drive motor may not accurately indicate the endpoint of a substrate assembly. For example, because the friction between the substrate assembly and the planarizing medium can increase or decrease throughout a planarizing cycle according to the topography of the substrate assembly and the materials, it may be difficult to identify a definite change in the motor current indicating that the endpoint has been reached. Moreover, other parameters that are not related to the drag force between the pad and the substrate assembly, such as friction losses and other power losses in the motors, gearboxes or other components, may change the current draw through the motors independently from the drag force or have a significantly greater magnitude than the drag force. The change in current through the drive motors, therefore, may not accurately reflect the drag force between the wafer and the polishing pad because the drag force is not the only factor or even the primary factor that influences the current draw. Thus, it would be desirable to develop an apparatus and method for more accurately endpointing planarization of microelectronic substrate assemblies.

It is also difficult to monitor or control other aspects of CMP processing because the chemical effects and mechanical effects separately influence the polishing rates and other variables of CMP processing. For example, the uniformity of the planarizing process and the polishing rate is a function of downforce, chemical effectiveness of the planarizing solution, distribution of abrasive particles, relative velocity between the substrate assembly and the polishing pad, pad condition, platen temperature and several other variables. As such, when unexpected results occur, the large number of variables in CMP processing makes it difficult to determine the source of a problem. Therefore, it would be desirable to develop an apparatus and method that accurately endpoints planarization of microelectronic substrate assemblies and simplifies controlling other process variables.

SUMMARY OF THE INVENTION

The present invention is directed toward mechanical and/or chemical-mechanical planarization of semiconductor wafers, field emission displays and other microelectronic substrate assemblies. One method of planarizing a microelectronic substrate assembly in accordance with the invention includes pressing a substrate assembly against a planarizing surface of a polishing pad at a pad/substrate interface defined by a surface area of the substrate assembly contacting the planarizing surface. The method continues by moving the substrate assembly and/or the polishing pad with respect to the other to rub at least one of the substrate assembly and the planarizing surface against the other at a relative velocity. As the substrate assembly and polishing pad rub against each other, a parameter indicative of drag force between the substrate assembly and the polishing pad is measured or sensed at periodic intervals. The measured drag force can be used to generate a plot of work or force versus time. The work/force versus time plot is then integrated to determine an estimated total work exerted at the pad/substrate interface. The planarizing process is terminated when the estimated change in thickness of the substrate assembly is at least approximately within a desired range for endpointing the substrate assembly according to a predetermined relationship between work and change in substrate assembly thickness.

DETAILED DESCRIPTION OF THE INVENTION

The present invention relates to planarizing machines and methods for monitoring and controlling planarizing processes in mechanical or chemical-mechanical planarization of microelectronic substrate assemblies. Many specific details of the invention are described below with reference to planarizing semiconductor wafers using web-format and rotary planarizing machines to provide a thorough understanding of such embodiments. For example, general aspects of a representative web-format planarizing machine and illustrative methods for controlling CMP processing using this machine are initially described below. Several detailed embodiments of planarizing machines for practicing methods in accordance with the invention are then described. The present invention, however, may have additional embodiments and/or can be practiced without several of the details described in the following description.

A. Representative Planarizing Machines and Monitoring Systems

Figure 1:
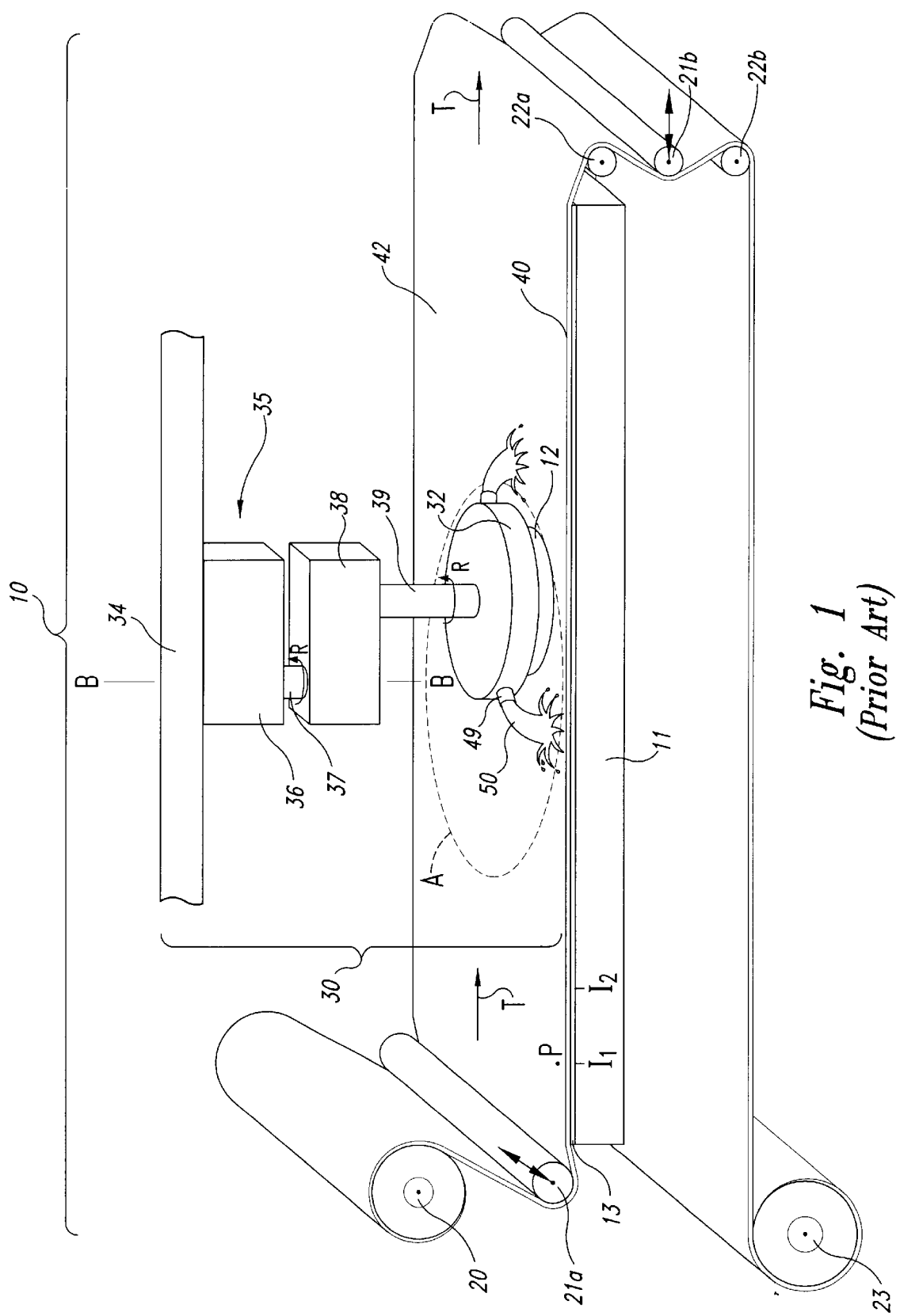
FIG. 1 is an isometric view of a web-format planarizing machine in accordance with the prior art.
Figure 2:
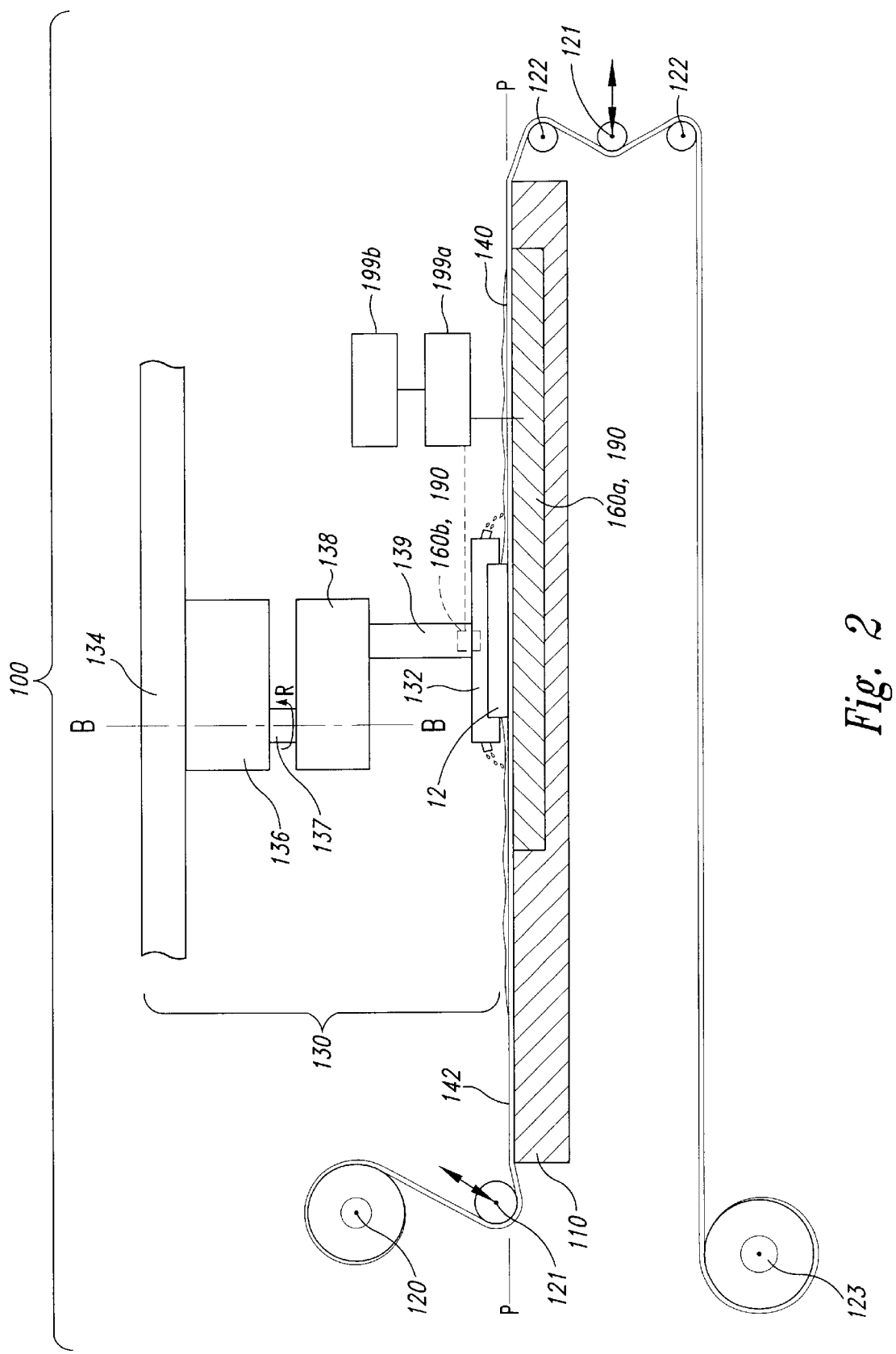
FIG. 2 is a schematic cross-sectional view of a web-format planarizing machine having a monitoring system in accordance with an embodiment of the invention.

FIG. 2 is a schematic cross-sectional view of a web-format planarizing machine 100 having a monitoring system for monitoring and controlling planarization of a microelectronic substrate assembly 12 in accordance with the invention. The planarizing machine 100 includes a table 110, a carrier assembly 130 over the table 110, and a polishing pad 140 on the table 110. The carrier assembly 130 and the polishing pad 140 can be substantially the same as those describe above with reference to FIG. 1. The polishing pad 140 is accordingly coupled to a pad-advancing mechanism having a plurality of rollers 120, 121, 122 and 123. The pad-advancing mechanism can also be the same as that described above with reference to FIG. 1.

The planarizing machine 100 also includes a monitoring system that measures the drag force between the substrate assembly 12 and the polishing pad 140 during planarization to endpoint or control other aspects of the CMP process. The monitoring system can include a drag force measuring assembly 160 (identified by reference numbers 160a and 160b), a processor 199a coupled to the drag force measuring assembly 160, and a database 199b coupled to the processor 199a. As explained below, the drag force measuring assembly 160 measures a parameter that accurately indicates the drag force at the interface between the pad 140 and the substrate assembly 12. The drag force measuring assembly 160 sends signals to the processor 199a corresponding to the measured drag forces, and the processor 199a calculates the total work exerted at the pad/substrate assembly interface from the drag force measurements. The processor 199a also correlates the total work exerted at the pad/substrate assembly interface with a predetermined correlation between work and substrate assembly thickness stored in the database 199b to determine an estimated substrate assembly thickness. The monitoring system uses the estimated substrate assembly thickness and the elapsed time to endpoint CMP processing or provide other diagnostic information.

The drag force measuring assembly 160 can be coupled to the table 110 and/or a carrier head 132 of the carrier assembly 130. The drag force measuring assembly 160 is generally configured to isolate a drag force parameter indicative of drag force between the substrate assembly 12 and the polishing pad 140 that is not influenced by energy losses in motors, gears or other components that drive either the polishing pad 140 or the carrier head 132. For example, the drag force parameter can be lateral displacement between components of the table 110 and/or the carrier head 132 corresponding to a shear force between the substrate assembly 12 and the planarizing surface 142 of the polishing pad 140. The drag force measuring assembly 160 includes at least one force detector 190 (shown schematically) that periodically measures the isolated drag force parameter and produces a signal corresponding to the measured drag forces. Several embodiments of force detectors 190 and drag force measuring assemblies that isolate the drag force parameter from power losses are described in detail below with reference to FIGS. 7–14.

The processor 199a processes the signals of the measured drag forces from the force detector 190 to determine the work exerted at the pad/substrate interface. As explained in greater detail below, the processor 199a can integrate the measured drag forces over time to determine an estimated work performed at the pad/substrate assembly interface. Several methods for controlling or endpointing CMP processing sing the calculated value of the estimated work are set forth below.

B. Illustrative Methods for Endpointing and Controlling CMP Processing

Figure 3:
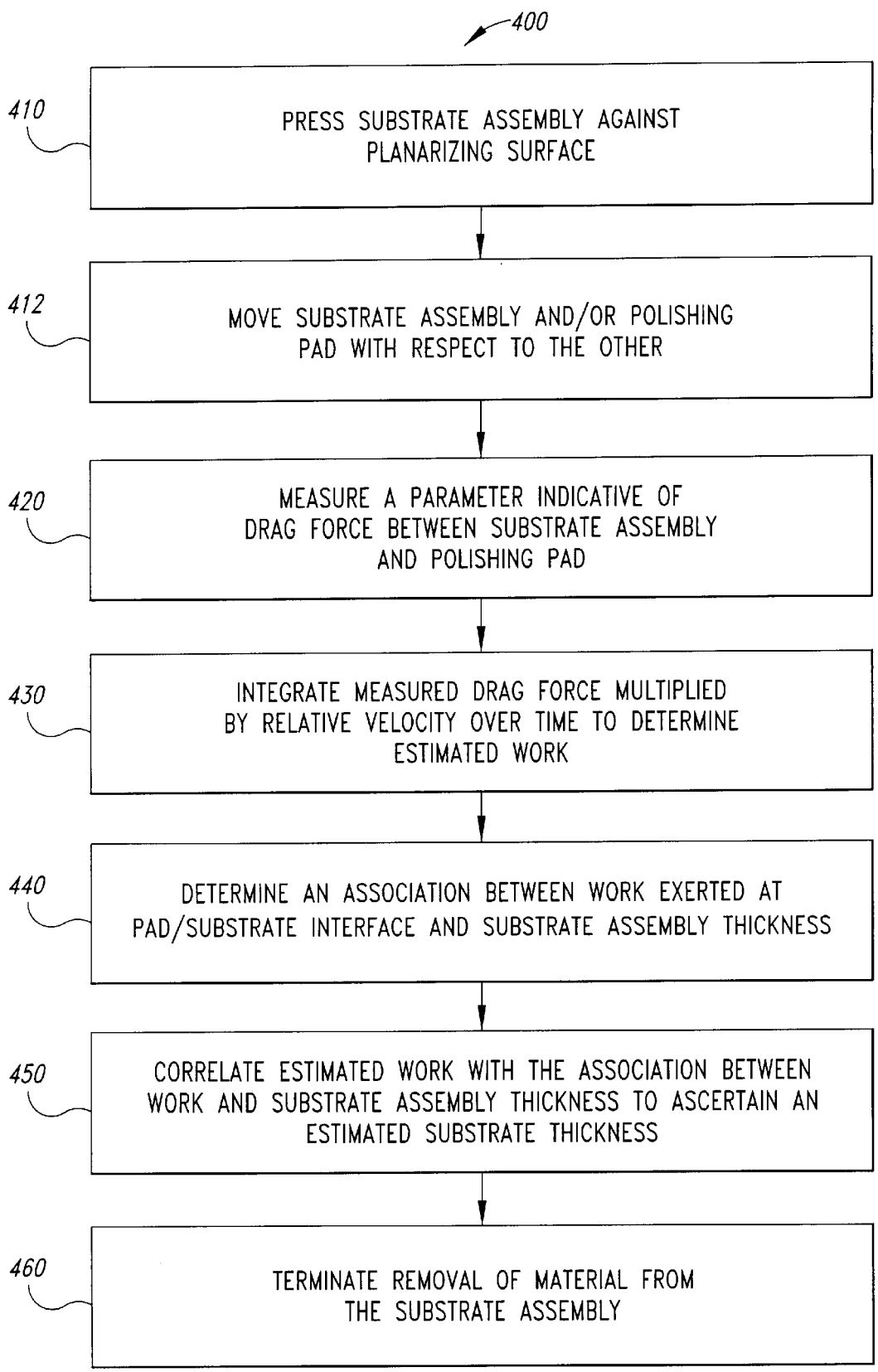
FIG. 3 is a flowchart of an illustrative method in accordance with one embodiment of the invention.

FIG. 3 is a flowchart of a method for endpointing CMP processing of the substrate assembly 12 in accordance with one embodiment of the invention. The method illustrated in FIG. 3 is a comprehensive method that includes several procedures that may be combined with each other or completely excluded in other embodiments of the invention. Accordingly, other embodiments of the invention may also include different procedures or a different order of procedures. As explained in more detail below, the CMP process of FIG. 3 is applicable to several different types of semiconductor wafers, field emission displays and other microelectronic substrate assemblies.

The planarizing process illustrated in FIG. 3 includes removing material from a substrate assembly by pressing the substrate assembly against a planarizing surface (procedure 410) and moving the substrate assembly and/or the polishing pad with respect to the other (procedure 412). The polishing pad can be the web-format pad 140 shown in FIG. 2 or a rotary pad. The polishing pad can also be a fixed-abrasive pad with abrasive particles fixedly attached to a suspension medium or a non-abrasive pad without abrasive particles. The substrate assembly is generally pressed against the polishing pad in the presence of a planarizing solution.

Figure 4A:
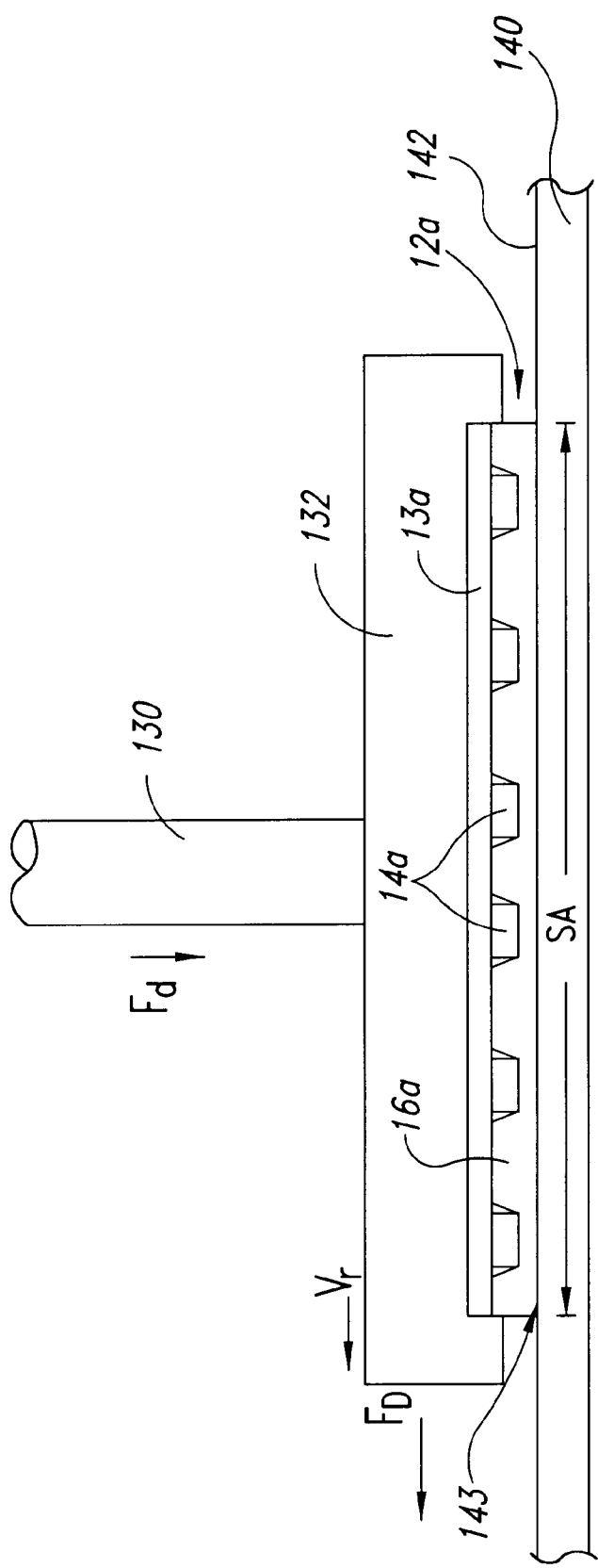
FIGS. 4A and 4B are schematic cross-sectional views of different substrate assemblies being planarized with a method in accordance with an embodiment of the invention.
Figure 4B:
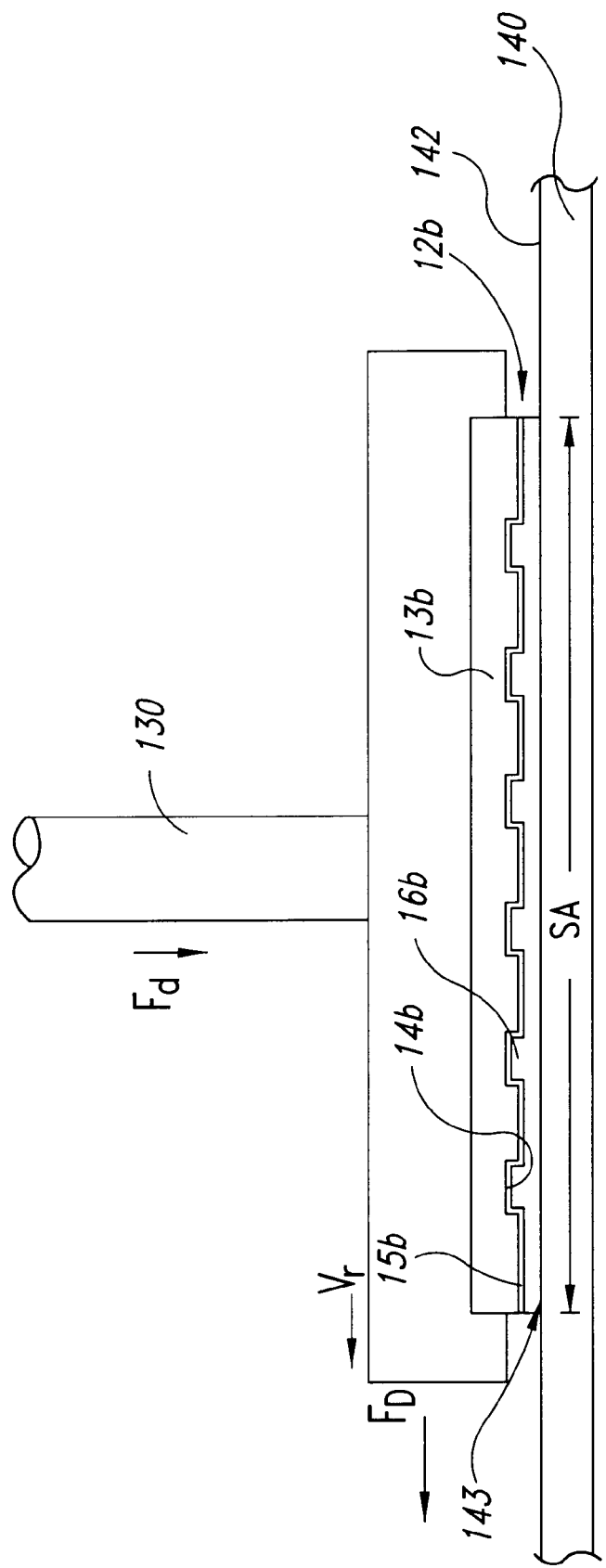

FIGS. 4A and 4B are schematic cross-sectional views illustrating the removal of material from two different types of substrate assemblies 12a and 12b in greater detail. The substrate assemblies 12a and 12b contact the planarizing surface 142 of the polishing pad 140 at a pad/substrate interface 143 defined by the surface area "SA" in contact with the planarizing surface 142. Referring to FIG. 4A, the carrier assembly 130 presses the substrate assembly 12a against the planarizing surface 142 at a downforce $F_d$. The carrier assembly 130 also moves the substrate assembly 12a with respect to the polishing pad 140 to rub the substrate assembly 12a against the planarizing surface 142 at a relative velocity $V_r$. The friction between the substrate assembly 12a and the planarizing surface 142 creates a drag force $F_D$ that acts against the polishing pad 140.

FIG. 4A, more specifically, illustrates a blanket oxide CMP process in which the substrate assembly 12a has a substrate 13a, a plurality of features 14a, and a blanket oxide layer 16 composed of doped or undoped silicon dioxide. FIG. 4B illustrates a Shallow-Trench-Isolation ("STI") planarizing process in which the substrate assembly 12b has a substrate 13b with a plurality of trenches 14b, a polish-stop layer 15b composed of a first material with a low polishing rate, and a fill layer 16b composed of a second material having a high polishing rate relative to the polish-stop layer 15b. The polish-stop layer 15b can be a layer of silicon nitride or carbon, and the fill layer 16b can be a layer of doped or undoped silicon dioxide. The different underlying structures and layers of the substrate assemblies 12a and 12b produce different drag forces $F_D$ at the pad/substrate interface 143, and thus the remaining procedures of the process shown in FIG. 3 are generally specific to each type of substrate assembly.

Referring again to FIG. 3, the planarizing process 400 continues with a measuring procedure 420 that includes measuring a drag force parameter indicative of the drag force $F_D$ between the substrate assembly 12 and the polishing pad 140. The drag force parameter is generally isolated from energy losses in components that drive either the polishing pad or the substrate assembly to provide a more accurate indication of the drag force $F_D$ at the pad/substrate interface 143 (FIG. 4A). Several devices for isolating and measuring the drag force parameter are described below with reference to FIGS. 7–14.

Figure 5A:
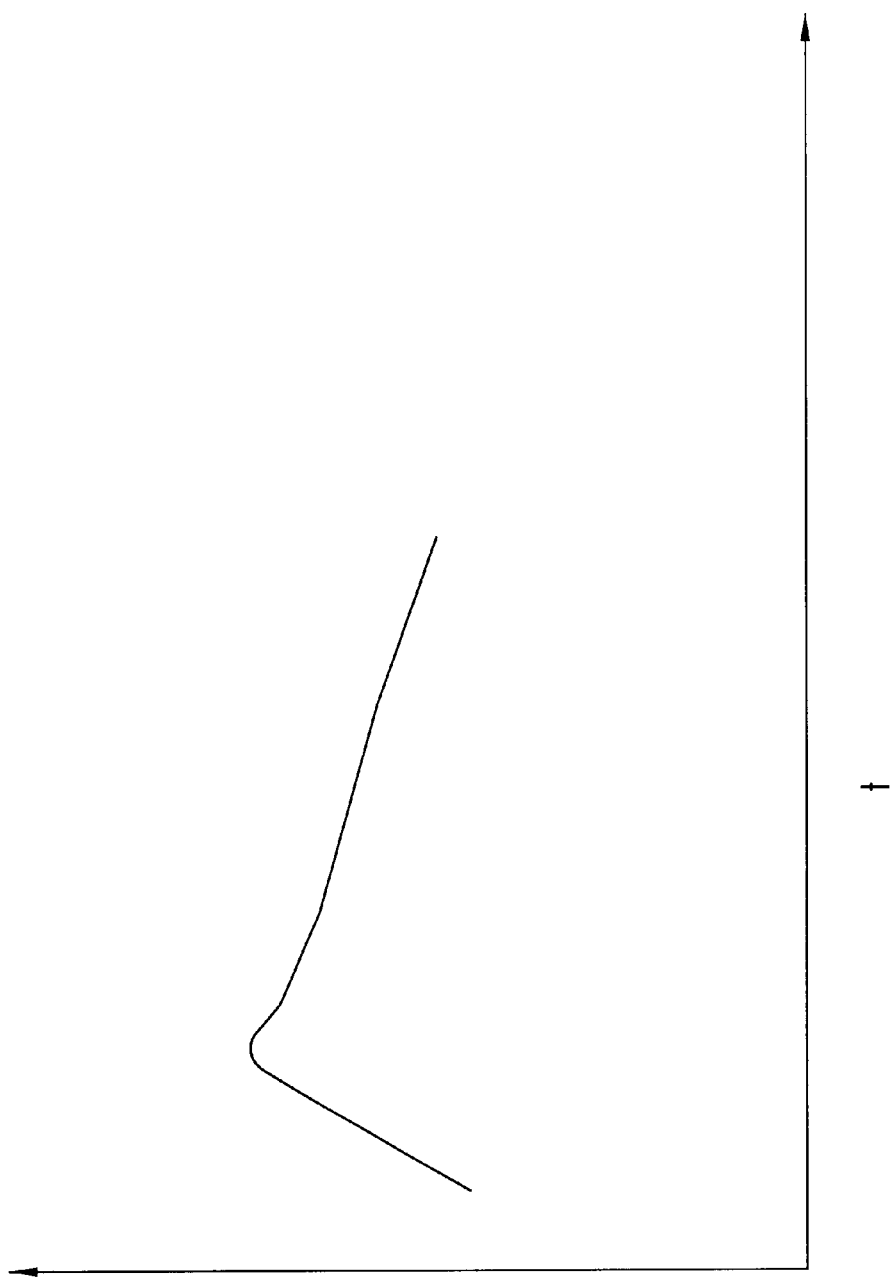
FIGS. 5A and 5B are graphs of drag force exerted at the pad/substrate interface over time in accordance with embodiments of the invention.
Figure 5B:
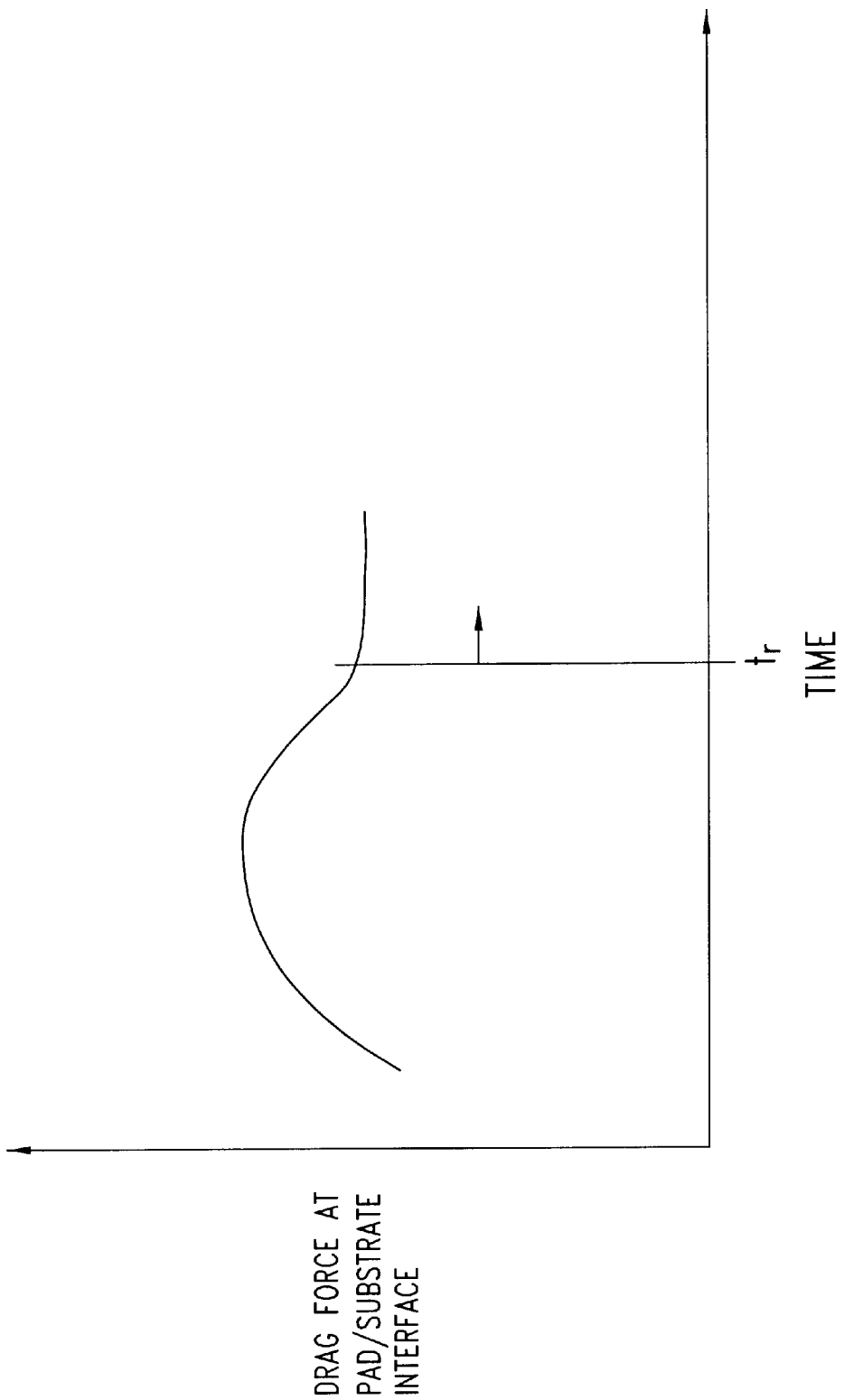

FIGS. 5A and 5B are graphs of the measured drag force $F_D$ at the pad/substrate interface over time. FIG. 5A, more specifically, illustrates the drag force at the pad/substrate interface for a blanket oxide substrate assembly similar to the substrate assembly 12a shown in FIG. 4A. FIG. 5B illustrates the drag force at the pad/substrate interface for an STI substrate assembly similar to the substrate assembly 12b shown in FIG. 4B. FIGS. 5A and 5B illustrate that different types of substrate assemblies produce different drag forces at the pad/substrate interface. The area under each plot may also change for different runs of the same type of substrate assembly because input variables, such as pad condition, may change over time.

The method 400 shown in FIG. 3 further continues with a data processing procedure 430 including determining the estimated work exerted at the pad/substrate interface during the planarizing cycle. The estimated work exerted at the pad/substrate interface is equal to the area under a plot of the measured drag force $F_D$ over the distance that the substrate assembly 12 translates across the pad 140. Because the relative velocity ($V_r$) between the substrate assembly 12 and the polishing pad 140 is generally substantially constant during a planarizing cycle, the distance that the substrate assembly 12 travels across the polishing pad 140 is equal to the relative velocity $V_r$ multiplied by the time period of the planarizing cycle. Accordingly, the total work ($W_T$) exerted at the pad/substrate interface can be expressed by the following equation:

$$W_T = \int_{t_0}^{t} F_D \cdot V_r \, dt.$$

The data processing procedure 430, for example, can thus include integrating the mathematical product of the measured drag force $F_D$ and the relative velocity $V_r$ over time to determine the estimated work exerted at the pad/substrate interface 143. In another embodiment, the data processing procedure can include integrating the measured drag force $F_D$ over time (dt) to determine the magnitude of the total drag force exerted against the substrate assembly 12 during the planarizing cycle.

The data processing procedure 430 of integrating the product of the measured drag force $F_D$ and the relative velocity $V_r$ over time to determine the estimated work can be performed by computer software or hardware using the trapezoidal method.

Suitable software programs and hardware for performing the data processing procedure 430 are commercially available and generally known to those skilled in semiconductor manufacturing arts.

The method 400 of FIG. 3 also includes a determining procedure 440 to determine an association between the work exerted at the pad/substrate interface and the change in substrate assembly thickness. The present inventors discovered that the change in thickness of the substrate assembly varies linearly with the work performed at the pad/substrate interface. A straight-line correlation between the change in substrate assembly thickness and work can be determined empirically for each type of substrate structure by planarizing a specific substrate assembly for a period of time, measuring the actual change in thickness of the substrate assembly, and calculating the estimated work exerted at the pad/substrate interface according to the measuring procedure 420 and the data processing procedure 430 described above with reference to FIGS. 4–5B.

Figure 6:
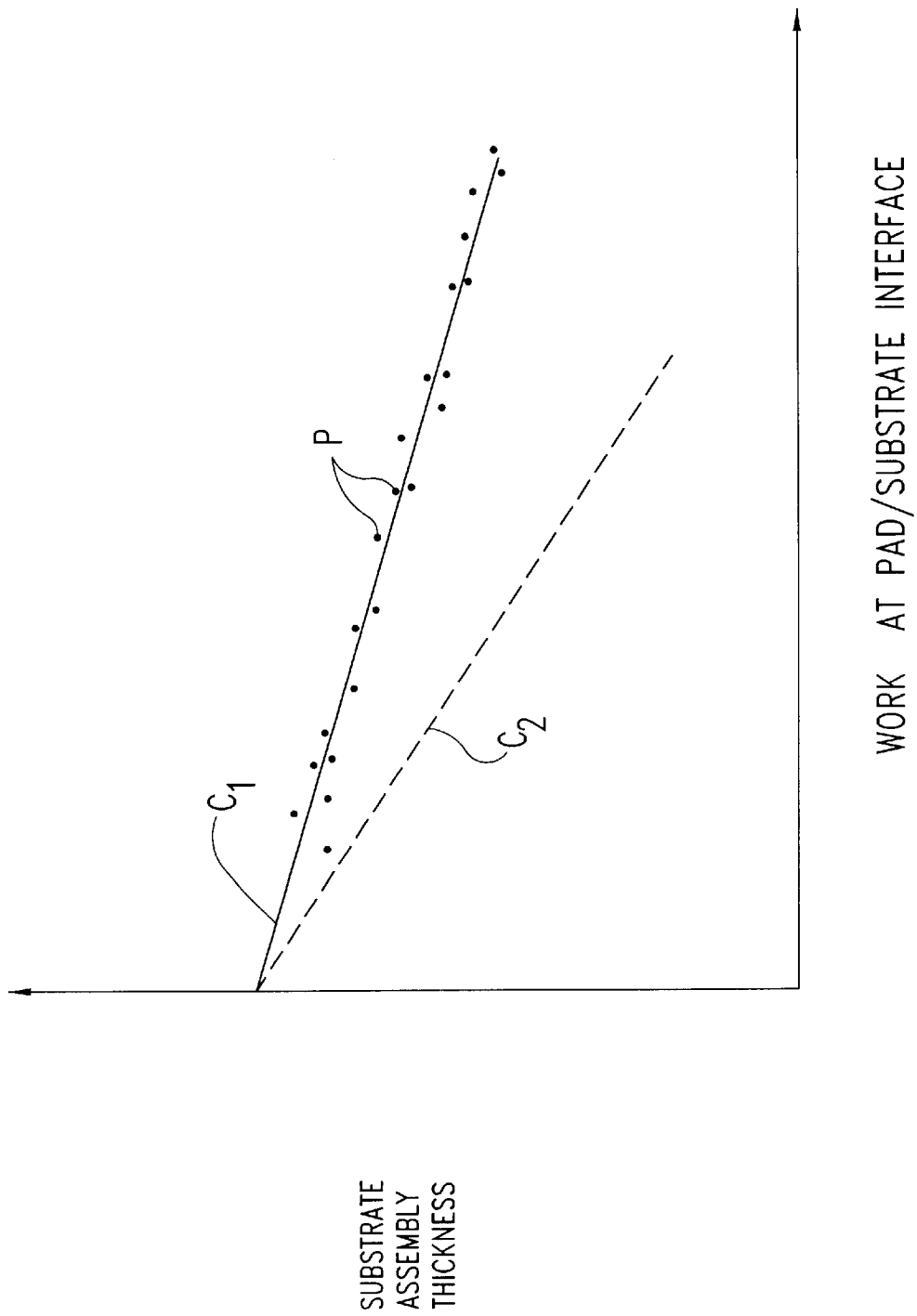
FIG. 6 is a graph illustrating an association between the substrate assembly thickness and work exerted at the pad/substrate interface.

FIG. 6, for example, is a graph showing a number of data points "P" for the measured substrate assembly thickness versus the estimated work at the pad/substrate interface. A mathematical regression can be performed using the data points P to determine a straight-line relationship between the substrate assembly thickness and work at the pad/substrate interface. In experimental applications of the determining procedure 440, the straight-line correlation generally has regression values of approximately 0.70–0.95. The association between substrate thickness and work is stored in the data bank 199b or the controller 199a.

The straight-line correlation between work or force and change in substrate assembly thickness has a different slope according to the chemical composition of the planarizing solution. Referring to FIG. 6, for example, the slope of the upper line corresponds to a planarizing solution having a first chemical composition $C_1$ and the slope of the lower line corresponds to a planarizing solution having a second chemical composition $C_2$. In general, more aggressive chemistries increase the downward slope of the work/thickness relationship. The different chemical solutions accordingly do not alter the basic operation of the methods described above, but rather they merely change the straight line relationship between work and change in substrate assembly thickness. Thus, the straight line relationship between work and change in substrate assembly thickness should be determined for each type of chemistry used in the planarizing solution.

The method 400 of FIG. 3 continues with a correlating procedure 450 in which the estimated work at the pad/substrate interface is correlated with the linear association between the work and substrate assembly thickness to ascertain an estimated substrate thickness. In one embodiment, the processor 199a inputs the estimated work into the straight-line equation correlating work and change in substrate thickness to calculate the estimated substrate thickness. The planarizing process 400 further includes an endpointing procedure 460 that terminates removal of material from the substrate assembly by removing the substrate assembly 12 from the polishing pad 140 when the estimated change in substrate thickness (e.g., the thickness of material removed from the substrate assembly by planarization) is at least approximately within a range of a desired substrate assembly thickness for endpointing the substrate assembly.

The method 400 of FIG. 3 can include different embodiments for determining the estimated change in thickness of a substrate assembly for a complete planarizing cycle or only a selected portion of the planarizing cycle. Referring to FIG. 5A, the entire area under the drag force versus time relationship for the blanket oxide CMP of the substrate assembly 12a (FIG. 4A) can be integrated to determine an estimated work. This particular embodiment accordingly determines an estimate of the total change in thickness of the blanket oxide substrate assembly 12a during the planarizing cycle. In another embodiment related to the STI substrate assembly 12b (FIG. 4B) and best shown by FIG. 5B, only the area under the drag force versus time curve after a reference time $t_r$ is integrated to determine the change in thickness of the endpointing layer 15 in the STI substrate assembly 12b. The reference time $t_r$ is generally determined by the change in slope from the downwardly sloping section to the relatively flat section of the drag force versus time curve shown in FIG. 5B. The reference time $t_r$ corresponds to the point in the planarizing cycle that the endpointing layer 15 becomes exposed to the polishing pad 140, and thus the integrated value after the reference time can be used with the straight-line correlation to determine the change in thickness of only the endpointing layer 15. The CMP processing of the STI substrate assembly 12b can be terminated when the change in thickness of the endpointing layer 15 is within a desired range.

C. Embodiments of Endpointing and Drag Force Measuring Assemblies

FIGS. 7–14 illustrate several embodiments of endpointing apparatuses that execute the measuring procedure 420 (FIG. 3) by isolating a drag force parameter related to the drag force between the substrate assembly 12 and the polishing pad 140 from other energy losses, and measuring the isolated drag force during planarization. For the following description, the endpointing apparatuses described in FIGS. 7–14 define one type of drag force measuring assembly 160 shown in FIG. 2. Therefore, it will be understood that the drag force measured with the endpointing apparatuses shown in FIGS. 7–14 can also be used to diagnose or control other aspects of the CMP processes described above with reference to FIGS. 2–6.

Figure 7:
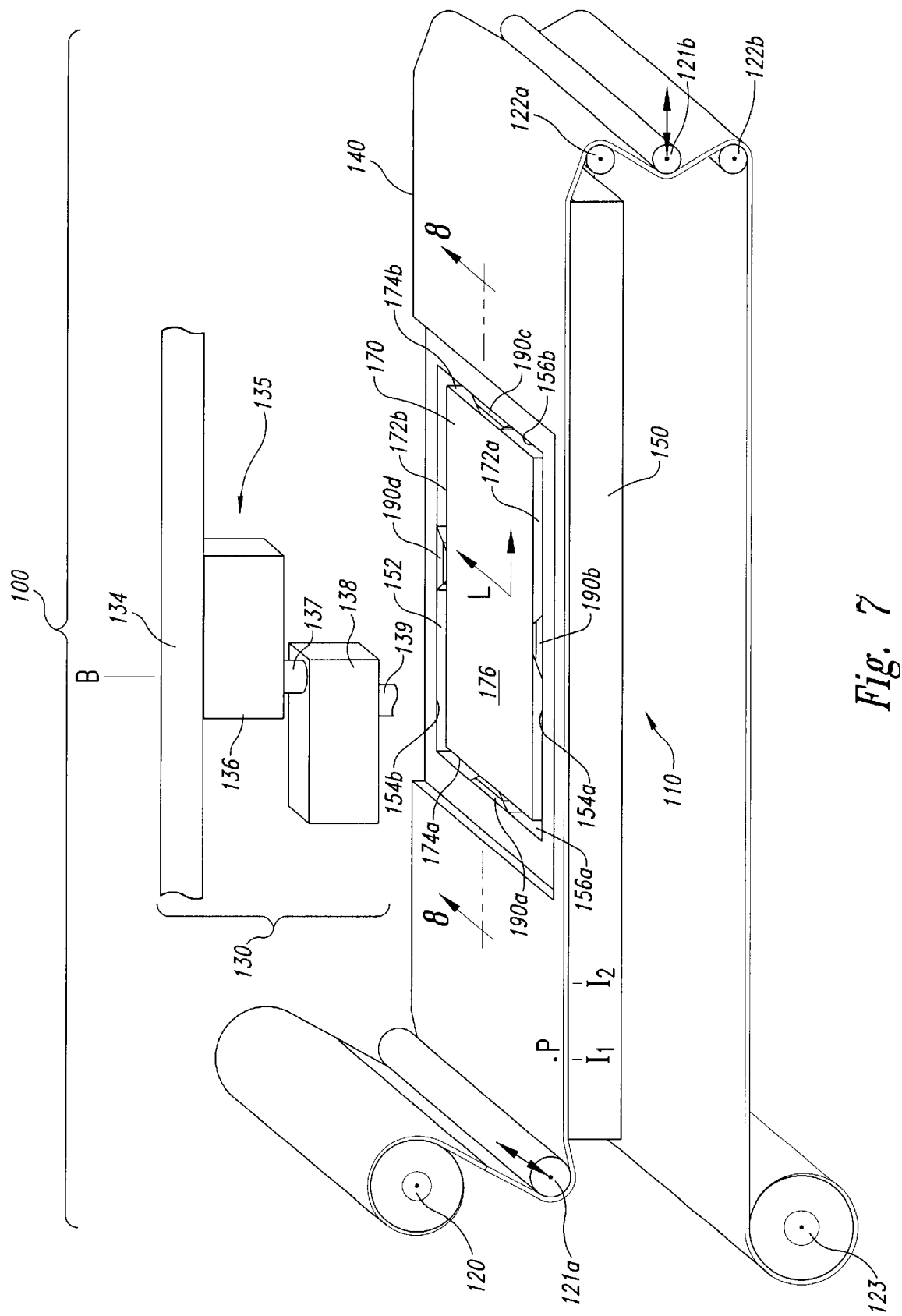
FIG. 7 is a schematic isometric view of a web-format planarizing machine having a cut-away portion illustrating an endpointing apparatus in accordance with an embodiment of the invention.

FIG. 7 is a schematic isometric view of the web-format planarizing machine 100 including an endpointing apparatus for measuring the drag force between the substrate assembly 12 and the polishing pad 140 during planarization. The endpointing apparatus generally includes a secondary support member defined by a sub-platen 150, a primary support member defined by a platen 170, and at least one force detector 190 between the sub-platen 150 and the platen 170. The platen 170 and the sub-platen 150 can be separate components of the table 110. The polishing pad 140 is releasably coupled to the platen 170 so that the drag forces $F_D$ between the substrate assembly 12 and the pad 140 exert lateral forces against the platen 170 independent of friction losses or power losses in the carrier assembly 130. The lateral force exerted by the pad 140 against the platen 170 is thus an isolated parameter indicative of the drag $F_D$ between the substrate assembly 12 and the pad 140.

Figure 8:
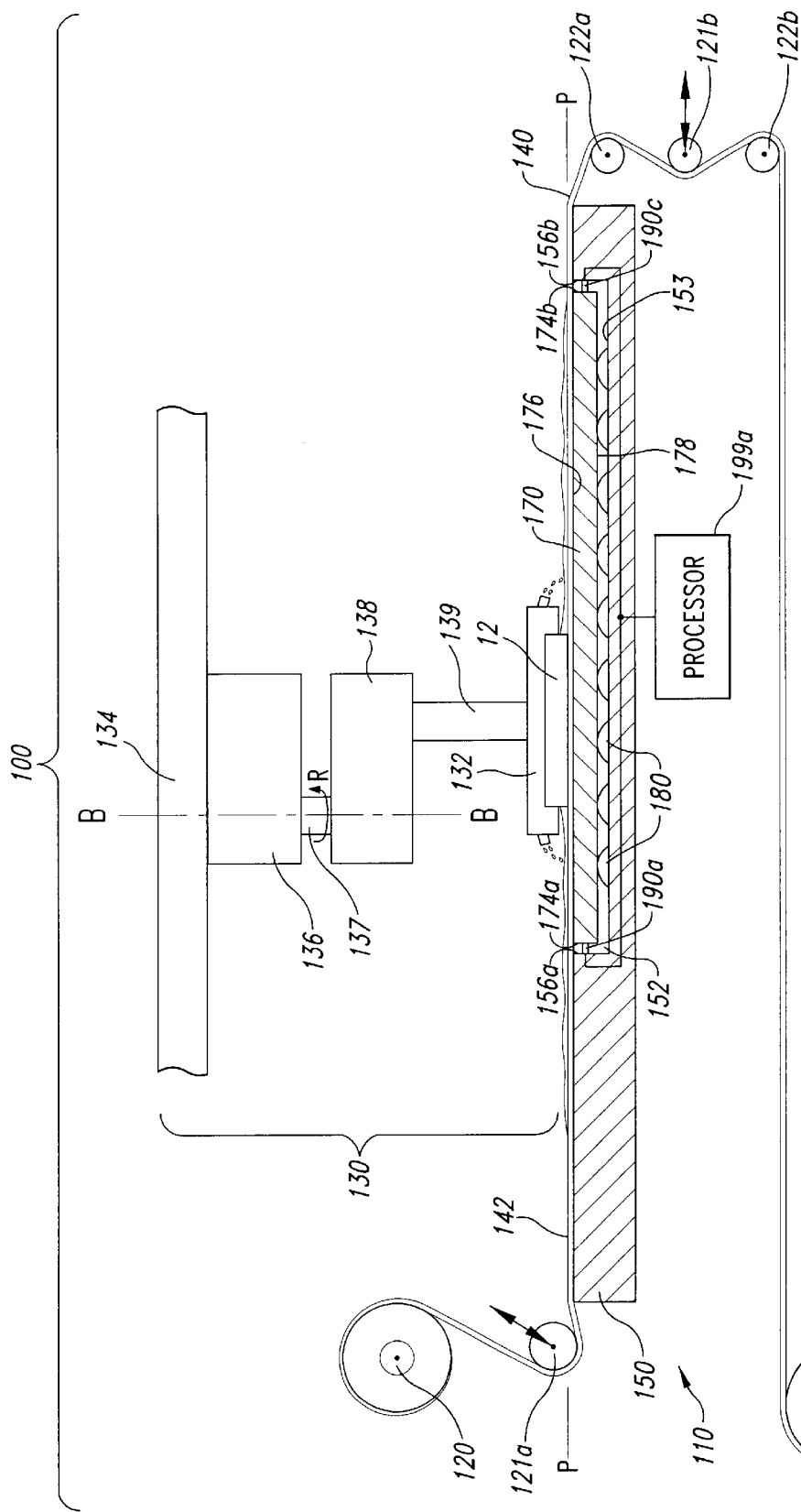
FIG. 8 is a schematic cross-sectional view of the planarizing machine of FIG. 7 along line 8—8.

FIG. 8 is a schematic cross-sectional view of the planarizing machine 100 illustrating the endpointing apparatus in greater detail. Referring to FIGS. 7 and 8 together, the sub-platen 150 can be a base supporting the platen 170. The sub-platen 150 has a recess 152 defined by a base surface 153 and a plurality of walls (identified by reference numbers 154a, 154b, 156a and 156b) projecting upwardly from the base surface 153 transversely with respect to a planarizing plane P—P (FIG. 8). For the purposes of the present disclosure, the term "transverse" means any non-parallel arrangement and is not limited to a perpendicular arrangement. The walls can include a first side-wall 154a, a second side-wall 154b opposite the first side-wall 154a, a first end-wall 156a at one end of the side-walls 154a and 154b, and a second end-wall 156b at the other end of the side-walls 154a and 154b. The walls can be configured in a rectilinear pattern or other suitable patterns to receive the platen 170.

The platen 170 is positioned in the recess 152 of the sub-platen 150. The platen 170 can be a plate having a first side-face 172a, a second side-face 172b opposite the first side-face 172a, a first end-face 174a between one end of the side-faces 172a and 172b, and a second end-face 174b between the other end of the side-faces 172a and 172b. In the embodiment shown in FIG. 3, the first side-face 172a is adjacent to the first side-wall 154a, the second side-face 172b is adjacent to the second side-wall 154b, the first end-face 174a is adjacent to the first end-wall 156a, and the second end-face 174b is adjacent to the second end-wall 156b. The platen 170 also includes a bearing surface 176 facing the backside of the polishing pad 140 to support at least a portion of the polishing pad 140 in a planarizing zone under the head 132. The platen 170 further includes a back surface 178 facing the base surface 153 of the sub-platen 150. The polishing pad 140 is coupled to the bearing surface 176 during planarization so that the pad transmits lateral forces to the platen 170. Suitable devices and methods for coupling the polishing pad 140 to the bearing surface 176 are disclosed in U.S. patent application Ser. No. 09/285,319 filed on Apr. 2, 1999, and Ser. No. 09/181,578 filed on Oct. 28, 1998, both of which are herein incorporated by reference.

The platen 170 can move with respect to the sub-platen 150 in a lateral motion L (FIG. 7) at least generally parallel to a planarizing plane P—P (FIG. 8). In this embodiment, the endpointing apparatus also includes a bearing mechanism 180 (FIG. 8) to reduce the friction between the base surface 153 of the sub-platen 150 and the back surface 178 of the platen 170. The bearing assembly 180 can be a roller mechanism having a plurality of rollers attached to either the sub-platen 150 or the platen 170 to allow the platen 170 to freely roll across the sub-platen 150. The bearing assembly 180 can also be a low-friction coating or lubricant between the base surface 153 and the back surface 178, or a flexible bladder (not shown) between the sub-platen 150 and the platen 170. In still another embodiment, the bearing assembly 180 can be a frictionless device having a number of air bearings defined by air holes through the sub-platen 150 that are connected to a pressurized air source that provides a continuous layer of air between the sub-platen 150 and the platen 170. In still another embodiment, the bearing assembly 180 can be a magnetic device including magnetic bearings that prevent the back surface 178 from contacting the base surface 153 by positioning magnetic fields of a like polarity adjacent to one another. In operation, the bearing assembly 180 can frictionally isolate the platen 170 from the sub-platen 150 so that the drag forces between the substrate assembly 12 and the pad 140 drive the platen 170 laterally with respect to the sub-platen 150 without substantial friction losses.

The force detectors 190 (identified by reference numbers 190a–190d) can be positioned between the walls of the recess 152 in the sub-platen 150 and the faces of the platen 170. Each force detector 190 can be a contact sensor that contacts both the sub-platen 150 and the platen 170 to sense the lateral forces exerted by the platen 170 against the sub-platen 150 in correlation to the lateral forces exerted by the substrate assembly 12 against the polishing pad 140 during planarization. Suitable contact force detectors are strain gauges, piezoelectric elements or other transducers that generate signals corresponding to the force exerted by the platen 170 against the sub-platen 150. The force detectors 190 can be other sensors that generate electrical signals corresponding to the lateral forces or displacement between the sub-platen 150 and the platen 170. For example, in other embodiments in which the force detectors 190 do not contact the platen 170 and the sub-platen 150 does not have dead stops so that the platen 170 can move relative to the sub-platen 150, the force detectors 190 can be lasers, accelerometers, capacitance displacement sensors, linear variable differential transformers or other displacement sensors.

In the particular embodiment of the planarizing machine 100 illustrated in FIGS. 7 and 8, four force detectors are configured along two orthogonal axes. In other embodiments, the planarizing machine 100 can have only one force detector positioned along one axis, or two force detectors positioned along two orthogonal axes, or any number of force detectors positioned between the walls of the sub-platen 150 and the faces of the platen 170. For example, in an embodiment having two force detectors 190 positioned along orthogonal axes, a first force detector 190a can contact the first end-wall 156a and the first end-face 174a at a first force detector site, a second force detector 190b can contact the first side-wall 154a and the first side-face 172a at a second force detector site, and dead stops can be substituted for the force detectors 190c and 190d. The first end-wall 156a and the first side-wall 154a of the sub-platen 150 accordingly define first and second stop surfaces, and the first end-face 174a and the first side-face 172a of the platen 170 accordingly define first and second contact surfaces. In still another embodiment, the first and second force detectors 190a and 190b can be positioned as explained above, and the dead stops or force detectors 190c and 190d can be eliminated by sizing the platen 170 such that the second end-face 174b abuts the second end-wall 156b and the second side-face 172b abuts the second side-wall 154b.

Figure 9:
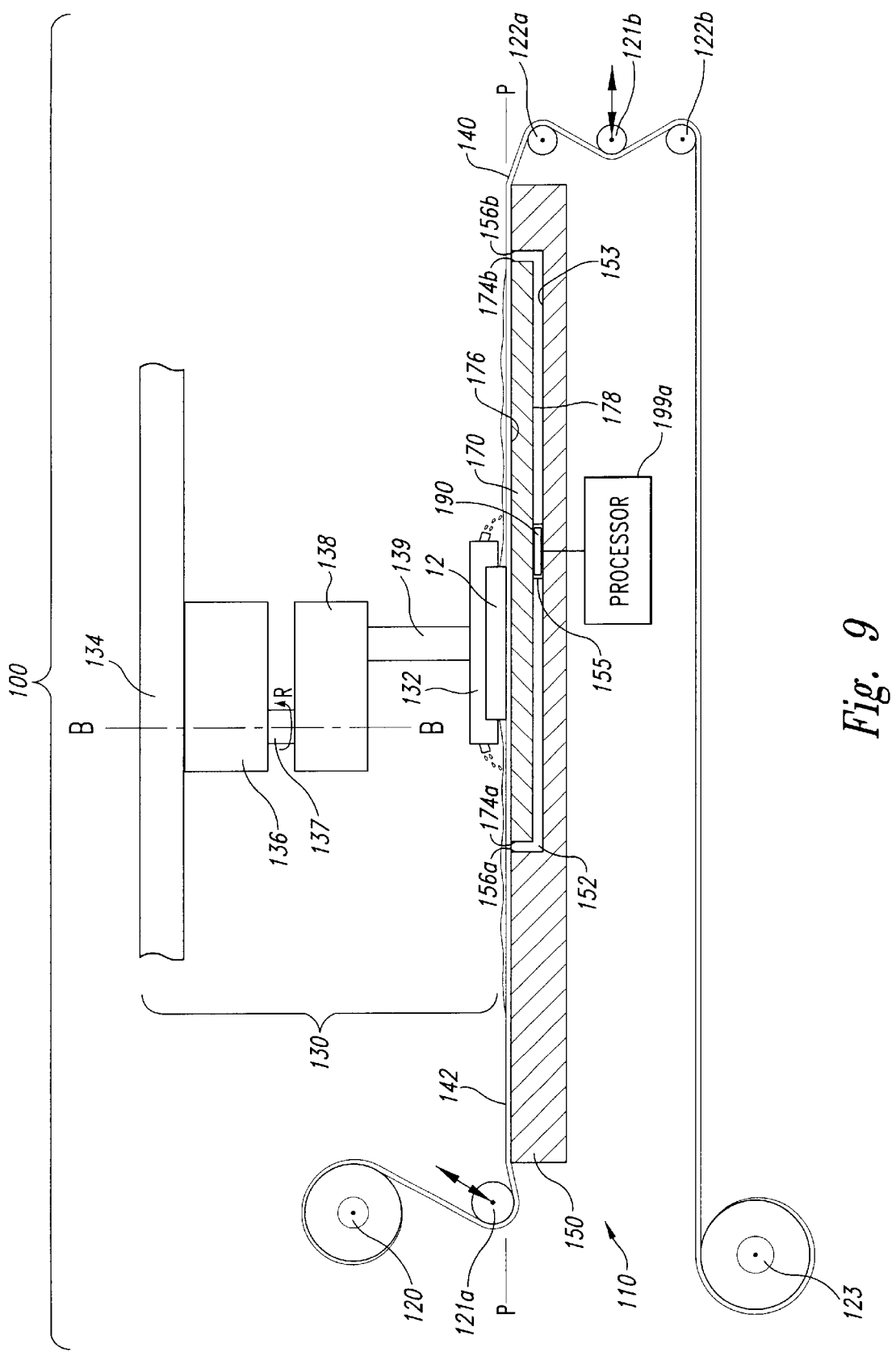
FIG. 9 is a schematic cross-sectional view of a planarizing machine in accordance with another embodiment of the invention.

FIG. 9 is a schematic cross-sectional view of the planarizing machine 100 in accordance with another embodiment of the invention. In this embodiment, the sub-platen 150 has a post 155 projecting upwardly from the base surface 153, and the platen 170 is fixedly attached to the post 155. The walls 172/174 of the platen 170 do not contact either dead stops, the faces 154/156 of the sub-platen 150, or other devices that inhibit the platen 170 from moving with respect to the sub-platen 150. The movement of the substrate assembly 12 across the polishing pad 140 accordingly displaces the platen 170 relative to the sub-platen 150 and generates torsional forces in the post 155 that are expected to be proportionate to the drag force between the substrate assembly 12 and the polishing pad 140. The force detector 190 can be a strain gauge attached to the post 155 to measure the torsional displacement of the post 155, a laser or other type of displacement sensor. The force detector 190 accordingly senses the change in the displacement of the torsional forces exerted on the platen 170 and sends a corresponding signal to the processor 199a.

Figure 10:
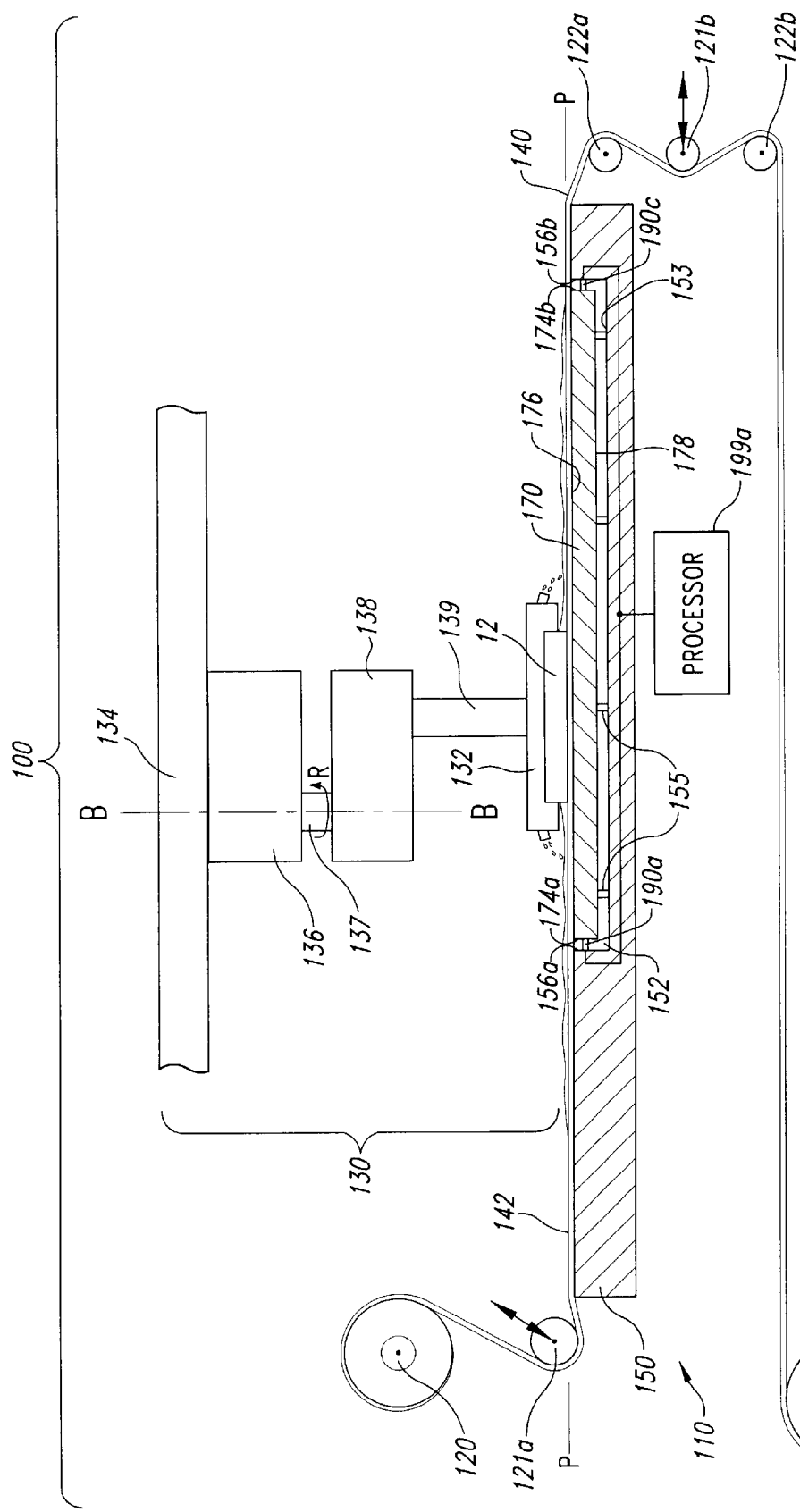
FIG. 10 is a schematic cross-sectional view of a planarizing machine in accordance with still another embodiment of the invention.

FIG. 10 is a schematic cross-sectional view of the planarizing machine 100 in accordance with another embodiment of the invention in which a number of small posts 155 attach the platen 170 to the sub-platen 150. As with the embodiment of the planarizing machine shown in FIG. 9, the walls 172/174 of the platen 170 do not contact either dead stops, the faces 154/156 of the sub-platen 150, or other devices that inhibit the platen 170 from moving with respect to the sub-platen 150. The posts 155 can be threaded studs having a diameter of approximately 1.0 inch and a length of 3.0 inches made from metal, high density polymers or other suitable materials. The posts 155 can also be other supports that can flex more in one direction than others, and the posts 155 can be made from other materials. The posts 155 of this embodiment accordingly do not frictionally isolate the platen 170 from the sub-platen 150, but rather they deflect to control the motion between the platen 170 and the sub-platen 150 in correspondence to the drag forces between the substrate assembly 12 and the polishing pad 140. The force detectors 190 accordingly measure the displacement between the platen 170 and the sub-platen 150 to determine the drag forces between the substrate assembly 12 and the polishing pad 140.

Figure 11:
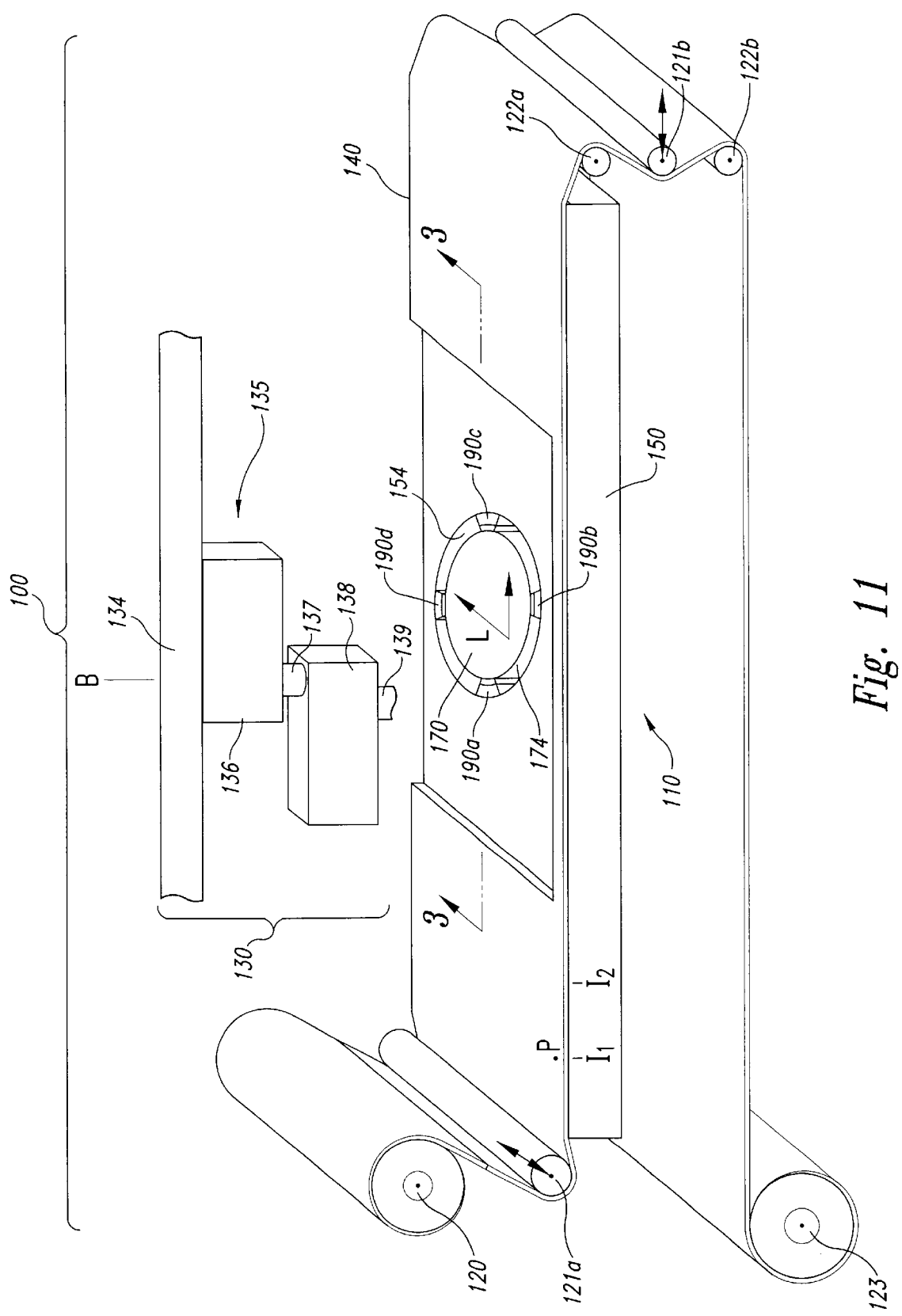
FIG. 11 is a schematic isometric view of a planarizing machine in accordance with another embodiment of the invention.

FIG. 11 is a schematic isometric view of a planarizing machine 100 in accordance with still another embodiment of the invention. In this embodiment, the planarizing machine 100 has a circular platen 170 and the recess 152 in the sub-platen 150 has a single circular wall 154. The platen 170 accordingly has a single, circular side-face 174. The platen 170 can be coupled to the sub-platen 150 by any of the bearings 180 or posts 155 described above with reference to FIGS. 7–10.

Figure 12:
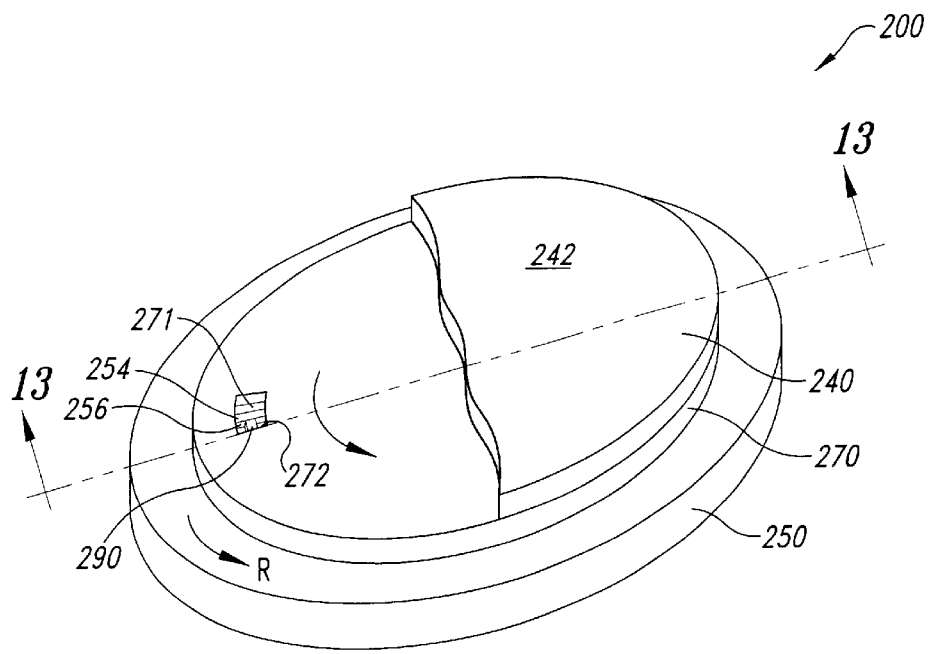
FIG. 12 is a schematic isometric view of a rotary planarizing machine with a cut-away section illustrating an endpointing apparatus in accordance with another embodiment of the invention.
Figure 13:
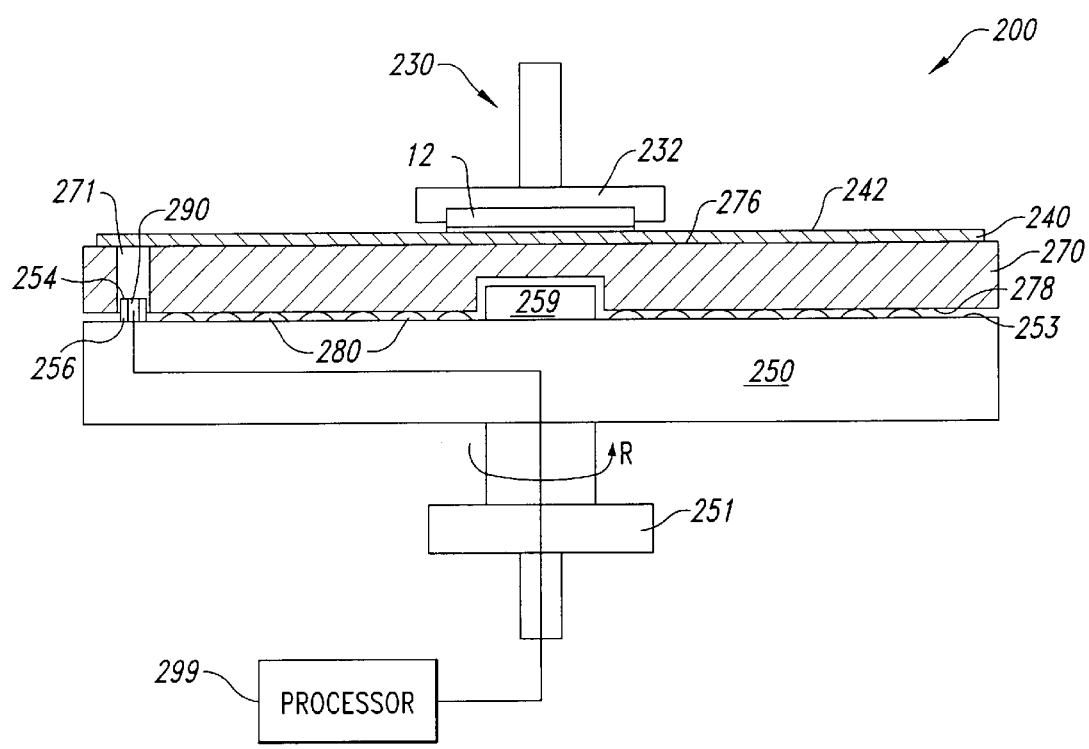
FIG. 13 is a schematic cross-sectional view of the planarizing machine of FIG. 12 taken along line 13—13.

FIG. 12 is a schematic isometric view of a planarizing machine 200 in accordance with another embodiment of the invention, and FIG. 13 is a schematic cross-sectional view of the planarizing machine 200 in FIG. 12 taken along line 13—13. The planarizing machine 200 has a sub-platen 250 coupled to a rotary drive mechanism 251 to rotate the sub-platen 250 (arrow R), a platen 270 movably coupled to the sub-platen 250, and a polishing pad 240 attached to the platen 270. The sub-platen 250 has a base surface 253 facing the polishing pad 240 and a tab 254 projecting upwardly from the base surface 253. The tab 254 has a stop surface 256 facing in the direction of the rotation of the sub-platen 250. The platen 270 includes an opening 271 having a contact surface 272 facing the stop surface 256 of the tab 254. The planarizing machine 200 further includes a bearing assembly 280 that can be the same as the bearing assembly 180 described above with reference to FIG. 8. The planarizing machine 200 also includes a force detector 290 contacting the stop surface 256 of the tab 254 and the contact surface 272 of the platen 270.

The planarizing machine 200 is expected to enhance the accuracy of detecting the endpoint of planarizing a substrate assembly in rotary planarizing applications. In operation, a carrier assembly 230 (FIG. 13) moves a carrier head 232 to press the substrate assembly 12 against a planarizing surface 242 of the polishing pad 240. The rotary drive assembly 251 also rotates the sub-platen 250 causing the tab 254 to press the force detector 290 against the contact surface 272. The sub-platen 250 accordingly rotates the platen 270 in the direction R, but the drag force between the substrate assembly 12 and the polishing pad 240 resists rotation in the direction R. The bearing assembly 280 allows the drag forces between the substrate assembly 12 and the planarizing surface 242 to drive the contact surface 272 of the platen 270 against the force detector 290 in correlation to the drag forces. As the drag force increases between the substrate assembly 12 and the planarizing surface 242, the force detector 290 accordingly detects an increase in the lateral force that the platen 270 exerts against the tab 254. The force detector 290 is coupled to a processor 299 to convert the signals from the force detector 290 into data that can be analyzed to determine the endpoint of the planarizing process as described above with reference to FIGS. 2–6.

Figure 14:
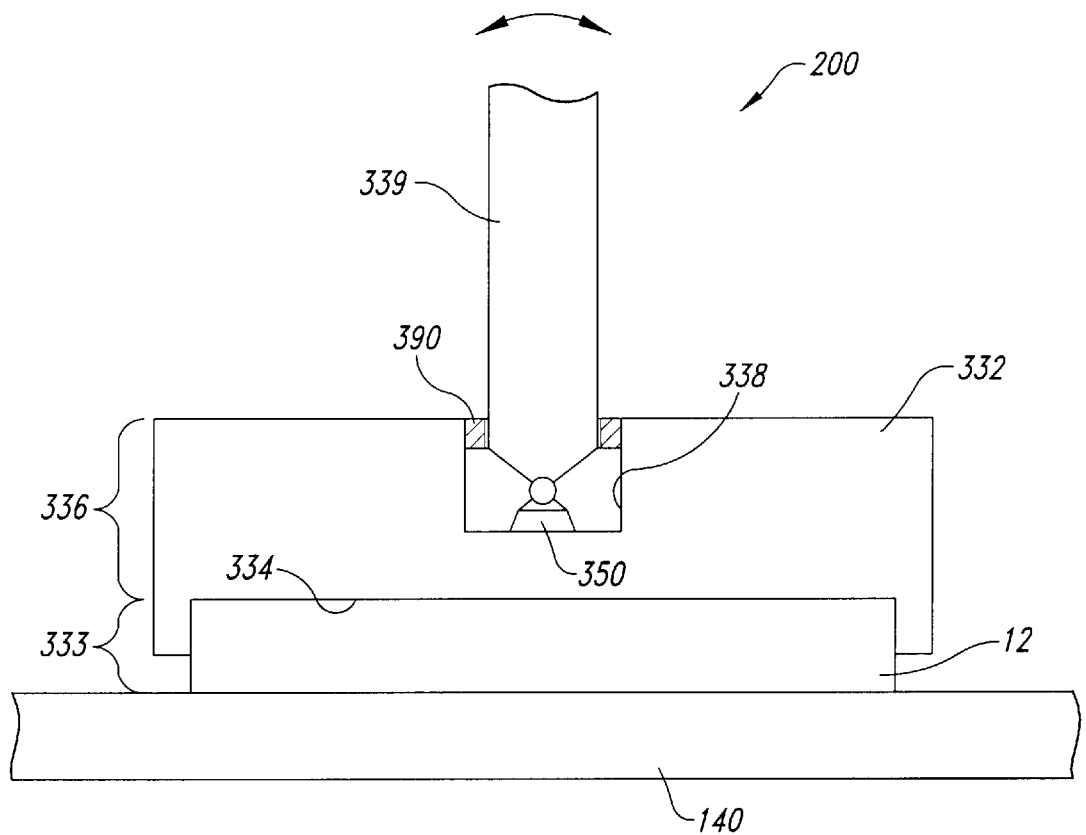
FIG. 14 is a schematic cross-sectional view of a substrate holder having an endpointing apparatus in accordance with yet another embodiment of the invention.

FIG. 14 is a schematic cross-sectional view of a carrier system 330 for a planarizing machine in accordance with another embodiment of the invention. The carrier assembly 330 can include a carrier head 332 having a lower portion 333 with a lower cavity 334 to receive a substrate assembly 12 and an upper portion 336 with an upper cavity 338. A pivoting joint 350 is attached to the head 332 in the cavity 338, and a drive-shaft 339 is pivotally attached to the joint 350. In this embodiment, the endpointing apparatus includes a primary support member defined by the head 332, a secondary support member defined by the drive-shaft 339, and a first contact surface defined by the side-wall of the upper cavity 338. In one embodiment, the joint 350 is a gimbal joint or other bearing assembly that allows universal pivoting between the head 332 and the shaft 339. The carrier head 332 also includes a force detector 390 attached to an interior wall of the cavity 338. The force detector 390, for example, can be an annular piezoelectric ring.

In operation, the drag forces between the substrate assembly 12 and the polishing pad 140 cause the shaft 339 to pivot about the joint 350 such that the lower end of the shaft 339 contacts the force detector 390. The force exerted by the driveshaft 339 against the force detector 390 will be proportional to the drag forces between the substrate assembly 12 and the polishing pad 140. Accordingly, the isolated drag force parameter of this embodiment is the displacement between the shaft 339 and the carrier head 332. The force detector 390 is coupled to a processor 199a (FIG. 2) to detect the endpoint of the planarizing process in a manner similar to that described above with respect to FIGS. 2–6.

D. Monitoring and Controlling Applications

The planarizing machines and methods described above with reference to FIGS. 2–14 are expected to enhance the accuracy of endpointing CMP processing is compared to processes and devices that monitor changes in the current of the drive motors. The methods described above with reference to FIGS. 2–6, for example, accurately endpoint CMP processing because they use the work exerted at the pad/substrate interface as the determinative value for estimating the endpoint. One aspect of these methods is that the inventors discovered a linear correlation between work at the pad/substrate interface and the change in thickness of the substrate assembly. Moreover, the work-thickness correlation is not affected by changes in the condition of the polishing pad, agglomerations of abrasive particles in the slurry, or other mechanical factors. The estimated work determined according to the embodiments set forth above with respect to FIGS. 2–6 accordingly provides an accurate estimate of the change in thickness of the substrate assembly during a planarizing cycle irrespective of changes in mechanical variables. Thus, compared to conventional endpointing methods, several embodiments of the methods described above with reference to FIGS. 2–6 can accurately endpoint CMP processing even though mechanical input variables change over time.

The planarizing machines described above with reference to FIGS. 2 and 7–14 are further expected to enhance the accuracy of endpointing CMP processing because they isolate a drag force parameter that is not influenced by energy losses unrelated to the drag force at the pad/substrate interface. In contrast to conventional planarizing processes that endpoint CMP processing using the current of the drive motors, several embodiments of the planarizing machines described above with reference to FIGS. 7–14 measure the drag force between the substrate assembly and the polishing pad by isolating the displacement or the lateral forces between either a platen and sub-platen, or a carrier head and a drive shaft. The isolated drag force parameter provides a much more accurate indication of the actual drag force at the pad/substrate interface than measuring motor current because energy losses and other factors associated with moving the carrier head or the polishing pad do not influence or otherwise overshadow the changes in drag force between the pad and the substrate assembly. The endpointing apparatuses and monitoring systems described above with reference to FIGS. 7–14, therefore, are expected to enhance the accuracy of detecting the endpoint in CMP processing.

The methods described above with reference to FIGS. 2–6 are also expected to enhance the accuracy of controlling and diagnosing CMP processing. Another aspect of several embodiments of the methods described above with reference to FIGS. 2–6 is that the source of unexpected problems in CMP processing can be diagnosed. Because the chemistry of the planarizing solution only changes the slope of the work/thickness relationship shown in FIG. 6, the source of an unexpected result in a specific run of wafers can be more readily identified. For example, unexpected results in the finished substrate assemblies can generally be attributed to changes in the chemical interaction between the planarizing solution and the substrate assembly because endpointing CMP processing by determining the estimate work at the pad/substrate interface is not influenced by mechanical variables. Therefore, by determining the estimated work at the pad/substrate interface, unexpected changes in chemical aspects of CMP processing can be more readily diagnosed.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector being attached to one side-wall of the cavity or the end section of the shaft;

pressing a substrate assembly against a planarizing surface of the polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad, wherein measuring the parameter includes sensing the lateral forces between the substrate assembly and the pad with the force detector at periodic intervals and generating a plot of measured drag force values versus time;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

2. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector being attached to one side-wall of the cavity or the end section of the shaft;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating total work includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

3. A method of planarizing a microelectronic substrate assembly, comprising:

providing a planarizing machine having a table including a base and a primary plate assembly moveable with respect to the base in a lateral motion corresponding to the lateral drag forces, a carrier head to hold the substrate assembly, and a force detector coupled to the primary plate assembly to sense lateral displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter indicative of drag force comprises sensing the lateral forces between the substrate assembly and the pad with the force detector;

estimating work at the pad/substrate interface; and terminating removal of material from the substrate assembly when the estimated work at the pad/substrate interface corresponds to a change in thickness according the linear relationship that is at least approximately within a range of desired change in thickness for endpointing the substrate assembly.

4. A method of planarizing a microelectronic substrate assembly, comprising:

providing a planarizing machine having a table including a base and a primary plate assembly moveable with respect to the base in a lateral motion corresponding to the lateral drag forces, a carrier head to hold the substrate assembly, and a force detector coupled to the primary plate assembly to sense lateral displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating work exerted at the pad/substrate interface by measuring drag force between the substrate assembly and the pad at periodic intervals and integrating the product of the measured drag force and the relative velocity over time; and terminating removal of material from the substrate assembly when the estimated work exerted at the pad/substrate interface corresponds to a change in thickness according the linear relationship that is at least approximately within a range of desired change in thickness for endpointing the substrate assembly.

5. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table to support the polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector being attached to one side-wall of the cavity or the end section of the shaft;

measuring a parameter indicative of drag force between the substrate assembly and the polishing pad at periodic intervals and generating a plot of measured drag force values versus time;

estimating total work exerted at the pad/substrate interface to rub the planarizing surface against the substrate assembly, wherein estimating total work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

6. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to a side-wall of the cavity;

pressing a substrate assembly against a planarizing surface of the polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals, wherein measuring the parameter includes sensing the lateral forces between the substrate assembly and the pad with the force detector and generating a plot of measured drag force values versus time;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

7. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to the end section of the shaft;

pressing a substrate assembly against a planarizing surface of the polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

8. A method of planarizing a microelectronic substrate assembly, comprising:

providing a planarizing machine having a table including a base and a primary plate movably attached to the base to move in a lateral motion corresponding to the lateral drag forces, a carrier head to hold the substrate assembly, and a force detector contacting a stop surface of the base extending transverse to a planarizing surface and a contact surface of the primary plate adjacent to the stop surface;

pressing a substrate assembly against the planarizing surface of a polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

9. A method of planarizing a microelectronic substrate assembly, comprising:

providing a planarizing machine having a table including a base and a primary plate assembly moveable with respect to the base in a lateral motion corresponding to the lateral drag forces, a carrier head to hold the substrate assembly, and a force detector coupled to the primary plate assembly to sense lateral displacement between the base and the primary plate corresponding to the lateral forces between the base and the primary plate, a polishing pad being removably attached to the primary plate;

pressing a substrate assembly against a planarizing surface of the polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

10. A method of planarizing a microelectronic substrate assembly, comprising:

providing a planarizing machine having a table including a base and a primary plate attached to the base by a post, a carrier head to hold the substrate assembly, and a force detector coupled to the post to sense displacement between the base and the primary plate corresponding to the lateral forces between the base and the primary plate, a polishing pad being removably attached to the primary plate;

pressing a substrate assembly against a planarizing surface of the polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

11. A method of planarizing a microelectronic substrate assembly, comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector coupled to at least one of the posts to detect deflection of the posts corresponding to the lateral displacement between the primary plate and the base;

pressing a substrate assembly against a planarizing surface of a polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

12. A method of planarizing a microelectronic substrate assembly, comprising:

providing a planarizing machine having a table including a base and a primary plate attached to the base by a plurality of flexible posts that deflect to allow lateral displacement between the primary plate and the base in correspondence to the lateral drag forces, a carrier head to hold the substrate assembly, and a force detector between a stop surface of the base extending transverse to the planarizing surface and a contact surface of the primary plate adjacent to the stop surface to detect the lateral drag forces;

pressing a substrate assembly against a planarizing surface of a polishing pad at a pad/substrate interface defined by a surface area of the substrate assembly contacting the planarizing surface;

moving the substrate assembly relative to the polishing pad to rub at least one of the substrate assembly and the planarizing surface against the other at a relative velocity;

determining an association between work exerted at the pad/substrate interface and a thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

integrating the product of the measured drag force values and the relative velocity over time to determine an estimated work exerted at the pad/substrate interface;

correlating the estimated work with the association between work at the pad/substrate interface and change in thickness of the substrate assembly to ascertain an estimated thickness of the substrate assembly; and terminating removal of material from the substrate assembly when the estimated thickness is at least approximately within a range of desired substrate assembly thickness for endpointing the substrate assembly.

13. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to a side-wall of the cavity;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

14. A method of planarizing a microelectronic substrate assembly, comprising:

providing a planarizing machine having a table to support a polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to the end section of the shaft;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

15. A method of planarizing a microelectronic substrate assembly, comprising:

providing a planarizing machine having a table including a base and a primary plate movably attached to the base to move in a lateral motion corresponding to the lateral drag forces, a carrier head to hold the substrate assembly, and a force detector contacting a stop surface of the base extending transverse to the planarizing surface and a contact surface of the primary plate adjacent to the stop surface;

removing material from a substrate assembly using a polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed at the pad/substrate interface includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

16. A method of planarizing a microelectronic substrate assembly, comprising:

providing a planarizing machine having a table including a base and a primary plate assembly moveable with respect to the base in a lateral motion corresponding to the lateral drag forces, a carrier head to hold the substrate assembly, and a force detector coupled to the primary plate assembly to sense lateral displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed at the pad/substrate interface includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

17. A method of planarizing a microelectronic substrate assembly, comprising:

providing a planarizing machine having a table including a base and a primary plate attached to the base by a post, a carrier head to hold the substrate assembly, and a force detector coupled to the post to sense displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

18. A method of planarizing a microelectronic substrate assembly, comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector coupled to at least one of the posts to detect deflection of the posts corresponding to the lateral displacement between the primary plate and the base;

removing material from a substrate assembly using a polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

19. A method of planarizing a microelectronic substrate assembly, comprising:

providing a planarizing machine having a table including a base and a primary plate attached to the base by a plurality of flexible posts that deflect to allow lateral displacement between the primary plate and the base in correspondence to the lateral drag forces, a carrier head to hold the substrate assembly, and a force detector between a stop surface of the base extending transverse to the planarizing surface and a contact surface of the primary plate adjacent to the stop surface to detect the lateral drag forces;

removing material from a substrate assembly using a polishing pad by rubbing at least one of the substrate assembly and the polishing pad against the other at a relative velocity, the substrate assembly contacting a planarizing surface of the polishing pad at a pad/substrate interface;

estimating total work exerted at the pad/substrate interface to rub the planarizing surface against the substrate assembly, wherein estimating work performed includes measuring the lateral forces between the substrate assembly and the pad with the force detector and determining an area under a line defined by a lateral force versus time plot; and terminating removal of material from the substrate assembly when the estimated work corresponds to a desired change in thickness of the substrate assembly according to a predetermined relationship between work and change in substrate assembly thickness.

20. A method of planarizing a microelectronic substrate assembly, comprising:

removing material from a substrate assembly using a polishing pad by rubbing at least one of the substrate assembly and a polishing pad against the other at a relative velocity, the substrate assembly contacting a planarizing surface of the polishing pad at a pad/substrate interface;

determining a predetermined relationship between work and substrate thickness by measuring drag force between the substrate assembly and the polishing pad, including measuring an actual thickness of the substrate assembly corresponding to each measured drag force to create work/thickness data points, and performing a mathematical regression of the data points to generate a straight-line association between work at the pad/substrate interface and thickness of the substrate assembly;

estimating total work exerted at the pad/substrate interface to rub the planarizing surface against the substrate assembly; and terminating removal of material from the substrate assembly when the estimated work corresponds to a desired change in thickness of the substrate assembly according to the predetermined relationship between work and change in substrate assembly thickness.

21. A method of planarizing a microelectronic substrate assembly, comprising:

removing material from a substrate assembly using a polishing pad by rubbing at least one of the substrate assembly and a polishing pad against the other at a relative velocity, the substrate assembly contacting a planarizing surface of the polishing pad at a pad/substrate interface;

determining the predetermined relationship between work and substrate thickness by measuring drag force between the substrate assembly and the polishing pad, including measuring an actual thickness of the substrate assembly corresponding to each measured drag force to create work/thickness data points, and performing a mathematical regression of the data points to generate a straight-line association between work at the pad/substrate interface and thickness of the substrate assembly;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness, further comprising:

correlating the estimated work with the straight line relationship to ascertain an estimated thickness of the substrate assembly; and disengaging the substrate assembly from the polishing pad when the estimated thickness of the substrate assembly is within a desired endpoint range.

22. A method of planarizing a microelectronic substrate assembly, comprising:

providing a planarizing machine having a table including a base and a primary plate attached to the base by a post, a carrier head to hold the substrate assembly, and a force detector coupled to the post to sense displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating work at the pad/substrate interface; and terminating removal of material from the substrate assembly when the estimated work at the pad/substrate interface corresponds to a change in thickness according the linear relationship that is at least approximately within a range of desired change in thickness for endpointing the substrate assembly.

23. A method of planarizing a microelectronic substrate assembly, comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector coupled to at least one of the posts to detect deflection of the posts corresponding to the lateral displacement between the primary plate and the base;

removing material from a substrate assembly using a polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating work at the pad/substrate interface; and terminating removal of material from the substrate assembly when the estimated work at the pad/substrate interface corresponds to a change in thickness according the linear relationship that is at least approximately within a range of desired change in thickness for endpointing the substrate assembly.

24. A method of planarizing a microelectronic substrate assembly, comprising:

providing a planarizing machine having a table including a base and a primary plate attached to the base by a post, a carrier head to hold the substrate assembly, and a force detector coupled to the post to sense displacement between the base and the primary plate corresponding to the lateral forces between the base and the primary plate, a polishing pad being removably attached to the primary plate;

removing material from a substrate assembly using the polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating work exerted at the pad/substrate interface by measuring drag force between the substrate assembly and the pad at periodic intervals and integrating the product of the measured drag force and the relative velocity over time; and terminating removal of material from the substrate assembly when the estimated work exerted at the pad/substrate interface corresponds to a change in thickness according the linear relationship that is at least approximately within a range of desired change in thickness for endpointing the substrate assembly.

25. A method of planarizing a microelectronic substrate assembly, comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector coupled to at least one of the posts to detect deflection of the posts corresponding to the lateral displacement between the primary plate and the base;

removing material from a substrate assembly using a polishing pad by rubbing at least one of the substrate assembly and the polishing pad against the other at a relative velocity, the substrate assembly contacting a planarizing surface of the polishing pad at a pad/substrate interface;

determining a linear relationship between work exerted at the pad/substrate interface and a change in thickness of the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating work exerted at the pad/substrate interface by measuring drag force between the substrate assembly and the pad at periodic intervals and integrating the product of the measured drag force and the relative velocity over time; and terminating removal of material from the substrate assembly when the estimated work exerted at the pad/substrate interface corresponds to a change in thickness according the linear relationship that is at least approximately within a range of desired change in thickness for endpointing the substrate assembly.

26. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table to support the polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to a side-wall of the cavity;

estimating total work exerted at the pad/substrate interface to rub the planarizing surface against the substrate assembly;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector; and terminating removal of material from the substrate assembly when the estimated work corresponds to a desired change in thickness of the substrate assembly according to a predetermined relationship between work and change in substrate assembly thickness.

27. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table to support the polishing pad, a carrier head and a force detector, the carrier head including a chuck having a bottom section including a substrate holder facing the pad, a top section including a cavity having a side-wall, a pivoting joint in the cavity, and a shaft having an end section received in the cavity and attached to the pivoting joint, and the force detector comprising a pressure sensitive ring attached to the end section of the shaft;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

28. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table including a base and a primary plate movably attached to the base to move in a lateral motion corresponding to the lateral drag forces, a carrier head to hold the substrate assembly, and a force detector contacting a stop surface of the base extending transverse to the planarizing surface and a contact surface of the primary plate adjacent to the stop surface;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

29. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table including a base and a primary plate assembly moveable with respect to the base in a lateral motion corresponding to the lateral drag forces, a carrier head to hold the substrate assembly, and a force detector coupled to the primary plate assembly to sense lateral displacement between the base and the primary plate corresponding to the lateral forces between the base and the primary plate, the polishing pad being removably attached to the primary plate;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

30. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

provideing a planarizing machine having a table including a base and a primary plate attached to the base by a post, a carrier head to hold the substrate assembly, and a force detector coupled to the post to sense displacement between the base and the primary plate corresponding to the lateral forces between the base and the primary plate, the polishing pad being removably attached to the primary plate;

measuring a parameter indicative of drag force between the substrate assembly and the polishing pad at periodic intervals and generating a plot of measured drag force values versus time, wherein measuring the parameter indicative of drag force comprises sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

31. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector coupled to at least one of the posts to detect deflection of the posts corresponding to the lateral displacement between the primary plate and the base;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

32. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

providing a planarizing machine having a table including a base and a primary plate attached to the base by a plurality of flexible posts that deflect to provide at least limited lateral displacement between the primary plate and the base in correspondence to the lateral drag forces, a carrier head to hold the substrate assembly, and a force detector contacting a stop surface of the base extending transverse to the planarizing surface and a contact surface of the primary plate adjacent to the stop surface to detect the lateral drag forces;

measuring a parameter indicative of drag force between the substrate assembly and the polishing pad at periodic intervals and generating a plot of measured drag force values versus time, wherein measuring the parameter includes sensing the lateral forces between the substrate assembly and the pad with the force detector;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness.

33. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

determining the predetermined relationship between work and substrate thickness by measuring drag force between the substrate assembly and the polishing pad, measuring an actual thickness of the substrate assembly corresponding to each measured drag force to create work/thickness data points, and performing a mathematical regression of the data points to generate a straight-line association between work at the pad/substrate interface and thickness of the substrate assembly;

measuring a parameter indicative of drag force between the substrate assembly and the polishing pad at periodic intervals and generating a plot of measured drag force values versus time;

determining a predetermined relationship between work and substrate thickness by measuring drag force between the substrate assembly and the polishing pad, measuring an actual thickness of the substrate assembly corresponding to each measured drag force to create work/thickness data points, and performing a mathematical regression of the data points to generate a straight-line association between work at the pad/substrate interface and thickness of the substrate assembly;

estimating total work exerted at the pad/substrate interface to rub the planarizing surface against the substrate assembly; and terminating removal of material from the substrate assembly when the estimated work corresponds to a desired change in thickness of the substrate assembly according to the predetermined relationship between work and change in substrate assembly thickness.

34. A method of endpointing a mechanical and/or chemical-mechanical planarizing process for microelectronic substrate assemblies in which material is removed from a substrate assembly by rubbing at least one of a substrate assembly and a polishing pad against the other at a relative velocity, the substrate assembly contacting a planarizing surface of the polishing pad at a pad/substrate interface, the method comprising:

measuring a parameter indicative of drag force between the substrate assembly and the polishing pad at periodic intervals and generating a plot of measured drag force values versus time;

estimating total work exerted at the pad/substrate interface to rub the planarizing surface against the substrate assembly; and terminating removal of material from the substrate assembly when the estimated work corresponds to a desired change in thickness of the substrate assembly according to a predetermined relationship between work and change in substrate assembly thickness, wherein terminating removal of material from the substrate assembly further comprises:

determining the predetermined relationship between work and substrate thickness by measuring drag force between the substrate assembly and the polishing pad, measuring an actual thickness of the substrate assembly corresponding to each measured drag force to create work/thickness data points, and performing a mathematical regression of the data points to generate a straight-line association between work at the pad/substrate interface and thickness of the substrate assembly;

correlating the estimated work with the straight line relationship to determine ascertain an estimated thickness of the substrate assembly; and disengaging the substrate assembly from the polishing pad when the estimated thickness of the substrate assembly is within a desired endpoint range.

* * * * *